United States Patent
Kim et al.

(10) Patent No.: US 12,328,866 B2
(45) Date of Patent: Jun. 10, 2025

(54) SEMICONDUCTOR DEVICES

(71) Applicant: SAMSUNG ELECTRONICS CO., LTD., Suwon-si (KR)

(72) Inventors: Hyosub Kim, Seoul (KR); Keunnam Kim, Yongin-si (KR); Manbok Kim, Yongin-si (KR); Soojeong Kim, Seoul (KR); Chulkwon Park, Hwaseong-si (KR); Seungbae Jeon, Cheonan-si (KR); Yoosang Hwang, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 108 days.

(21) Appl. No.: 18/327,920

(22) Filed: Jun. 2, 2023

(65) Prior Publication Data
US 2023/0309293 A1    Sep. 28, 2023

Related U.S. Application Data

(63) Continuation of application No. 17/229,942, filed on Apr. 14, 2021, now Pat. No. 11,706,910.

(30) Foreign Application Priority Data

Sep. 15, 2020    (KR) .................... 10-2020-0118300

(51) Int. Cl.
H10B 12/00       (2023.01)
(52) U.S. Cl.
CPC ....... *H10B 12/315* (2023.02); *H10B 12/0335* (2023.02); *H10B 12/053* (2023.02); *H10B 12/34* (2023.02); *H10B 12/482* (2023.02)

(58) Field of Classification Search
None
See application file for complete search history.

(56) References Cited

U.S. PATENT DOCUMENTS 8,969,936 B2   3/2015   Lee et al.
9,337,203 B2   5/2016   Hwang et al.
(Continued)

FOREIGN PATENT DOCUMENTS

CN      105719998 A    6/2016
JP      2016009801 A   1/2016
(Continued)

OTHER PUBLICATIONS

Extended European Search Report corresponding to EP 21176527.6; dated Nov. 18, 2021 (7 pages).

*Primary Examiner* — Steven M Page
(74) *Attorney, Agent, or Firm* — Myers Bigel, P.A.

(57) ABSTRACT

Semiconductor devices may include an active pattern, a gate structure in an upper portion of the active pattern, a bit line structure on the active pattern, a lower spacer structure on a lower portion of a sidewall of the bit line structure, and an upper spacer structure on an upper portion of the sidewall of the bit line structure. The lower spacer structure includes first and second lower spacers sequentially stacked, the first lower spacer contacts the lower portion of the sidewall of the bit line structure and does not include nitrogen, and the second lower spacer includes a material different from the first lower spacer. A portion of the upper spacer structure contacting the upper portion of the sidewall of the bit line structure includes a material different from the first lower spacer.

20 Claims, 27 Drawing Sheets

(56) References Cited

U.S. PATENT DOCUMENTS

| | | |
|---|---|---|
| 9,515,022 B2 | 12/2016 | Kwon et al. |
| 9,786,598 B2 | 10/2017 | Kim et al. |
| 10,297,495 B2 | 5/2019 | Lee et al. |
| 2014/0264953 A1 | 9/2014 | Lim et al. |
| 2015/0162335 A1* | 6/2015 | Kim ........................ H10B 12/34 438/618 |
| 2018/0342520 A1* | 11/2018 | Chun ................ H01L 21/76877 |
| 2019/0067294 A1 | 2/2019 | Lee et al. |
| 2019/0088739 A1 | 3/2019 | Lee et al. |
| 2019/0206873 A1* | 7/2019 | Kim ..................... H10B 12/485 |
| 2019/0333918 A1 | 10/2019 | Kim et al. |
| 2020/0266198 A1 | 8/2020 | Ji et al. |

FOREIGN PATENT DOCUMENTS

| | | |
|---|---|---|
| KR | 101883656 B1 | 7/2018 |
| KR | 20190112443 A | 10/2019 |

* cited by examiner

SEMICONDUCTOR DEVICES

CROSS-REFERENCE TO RELATED APPLICATION

This application is a continuation of U.S. patent application Ser. No. 17/229,942, filed Apr. 14, 2021, which claims priority under 35 U.S.C. § 119 to Korean Patent Application No. 10-2020-0118300 filed on Sep. 15, 2020, in the Korean Intellectual Property Office, the disclosure of which is hereby incorporated by reference in its entirety.

FIELD

Example embodiments of the present disclosure relate to a semiconductor device. More particularly, example embodiments of the present disclosure relate to a Dynamic Random Access Memory (DRAM) device including a bit line structure.

BACKGROUND

A bit line structure of a DRAM device may have a stacked structure including a first conductive pattern including doped polysilicon and a second conductive pattern including metal. The bit line structure may contact a recess of an active pattern to be electrically connected thereto, and a lower portion of a spacer structure on a sidewall of the bit line structure may be formed in the recess. If the bit line structure has a narrow width, current flowing therethrough may not be enough for proper operations of the device. However, increasing the width of the bit line structure may be limited due to the size of the recess.

SUMMARY

Example embodiments provide semiconductor devices having improved characteristics and methods of forming the same.

According to example embodiments of the inventive concepts, semiconductor devices may include an active pattern on a substrate, a gate structure in (e.g., buried at) an upper portion of the active pattern, a bit line structure on the active pattern, a lower spacer structure extending on (e.g., covering) a lower portion of a sidewall of the bit line structure, an upper spacer structure extending on (e.g., covering) an upper portion of the sidewall of the bit line structure, a contact plug structure on the active pattern (e.g., an upper portion of the active pattern) adjacent to the bit line structure, and a capacitor on the contact plug structure. The lower spacer structure may include a first lower spacer and a second lower spacer sequentially stacked on the substrate (e.g., sequentially stacked in a horizontal direction that may be substantially parallel to an upper surface of the substrate), the first lower spacer may contact the lower portion of the sidewall of the bit line structure and may not include nitrogen, and the second lower spacer may include a material different from that of the first lower spacer. A portion of the upper spacer structure may contact the upper sidewall of the bit line structure and may include a material different from that of the first lower spacer.

According to example embodiments of the inventive concepts, semiconductor devices may include an active pattern on a substrate, a gate structure in (e.g., buried at) an upper portion of the active pattern, a bit line structure on the active pattern and including a first conductive pattern, a diffusion barrier, a second conductive pattern and a capping pattern sequentially stacked on the substrate (e.g., sequentially stacked in a vertical direction that may be substantially perpendicular to an upper surface of the substrate), a lower spacer structure extending on (e.g., covering) a sidewall of at least a portion of the first conductive pattern of the bit line structure, an upper spacer structure on the lower spacer structure and extending on (e.g., covering) a portion of a sidewall of the bit line structure, a contact plug structure on the active pattern (e.g., an upper portion of the active pattern) adjacent to the bit line structure, and a capacitor on the contact plug structure. The first conductive pattern may include polysilicon doped with n-type impurities, and the second conductive pattern may include metal. The lower spacer structure may include a first lower spacer and a second lower spacer sequentially stacked on the sidewall of the at least the portion of the first conductive pattern of the bit line structure (e.g., sequentially stacked in a horizontal direction that may be substantially parallel to the upper surface of the substrate), the first lower spacer may contact the sidewall of the at least a portion of the first conductive pattern and may include oxide, and the second lower spacer may include nitride. The first lower spacer does not contact the portion of the sidewall of the bit line structure, and portion of the upper spacer structure may contact the sidewall of the bit line structure and may include nitride.

According to example embodiments of the inventive concepts, semiconductor devices may include an active pattern on a substrate, a gate structure in (e.g., buried at) an upper portion of the active pattern, a bit line structure on the active pattern and including a first conductive pattern, a second conductive pattern and a capping pattern sequentially stacked on the substrate (e.g., sequentially stacked in a vertical direction that may be substantially perpendicular to an upper surface of the substrate), a first spacer on a sidewall of the first conductive pattern and including silicon oxide, a second spacer extending on (e.g., covering) an outer sidewall of the first spacer and sidewalls of the second conductive pattern and the capping pattern, a third spacer and a fourth spacer sequentially stacked on a lower portion of an outer sidewall of the second spacer (e.g., sequentially stacked in a horizontal direction that may be substantially parallel to the upper surface of the substrate), a fifth spacer and a sixth spacer sequentially stacked on an upper outer sidewall of the second spacer (e.g., sequentially stacked in the horizontal direction), a contact plug structure on the active pattern (e.g., an upper portion of the active pattern) adjacent to the bit line structure, and a capacitor on the contact plug structure.

According to example embodiments of the inventive concepts, semiconductor devices may include an active pattern on a substrate, a gate structure in (e.g., buried at) an upper portion of the active pattern and extending in a first direction that may be substantially parallel to an upper surface of the substrate, a bit line structure extending in a second direction that may be substantially parallel to the upper surface of the substrate and substantially perpendicular to the first direction, an upper surface of a middle portion of the active pattern in a length direction of the active pattern being recessed toward the substrate, the bit line structure contacting the upper surface of the middle portion of the active pattern, and the bit line structure including a first conductive pattern, a diffusion barrier, a second conductive pattern and a capping pattern sequentially stacked on the substrate (e.g., sequentially stacked in a vertical direction that may be substantially perpendicular to the upper surface of the substrate), a lower spacer structure extending on (e.g., covering) a sidewall of at least a portion of the first conductive pattern of the bit line structure, and including a first lower spacer and a second lower spacer sequentially stacked on the sidewall of the at least the portion of the first conductive pattern of the bit line structure (e.g., sequentially stacked in a horizontal direction that may be substantially parallel to the upper surface of the substrate), an upper spacer structure extending on (e.g., covering) a sidewall of a portion of the bit line structure not covered by the lower spacer structure, and including a first upper spacer, a second upper spacer and a third upper spacer sequentially stacked on the sidewall of the portion of the bit line structure (e.g., sequentially stacked in the horizontal direction), a contact plug structure on one of opposing end portions of the active pattern in the length direction of the active pattern, and including a lower contact plug, an ohmic contact pattern, a barrier layer and an upper contact plug sequentially stacked on the substrate (e.g., sequentially stacked in the vertical direction), and a capacitor on the contact plug structure. The first lower spacer may contact the sidewall of the at least the portion of the first conductive pattern of the bit line structure and may not include nitrogen, and the second lower spacer may include a material different from that of the first lower spacer. The first upper spacer may contact the sidewall of the portion of the bit line structure not covered by the lower spacer structure and may include a material different from that of the first lower spacer.

In the semiconductor devices, currents may easily flow through the bit line structure, and thus the semiconductor devices including the bit line structure may have enhanced electrical characteristics.

DETAILED DESCRIPTION

The above and other aspects and features of methods of cutting a fine pattern, methods of forming active patterns using the same, and methods of manufacturing a semiconductor device using the same in accordance with example embodiments of the inventive concepts will become readily understood from detail descriptions that follow, with reference to the accompanying drawings. It will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second or third element, component, region, layer or section without departing from the teachings of inventive concepts.

Figure 1:
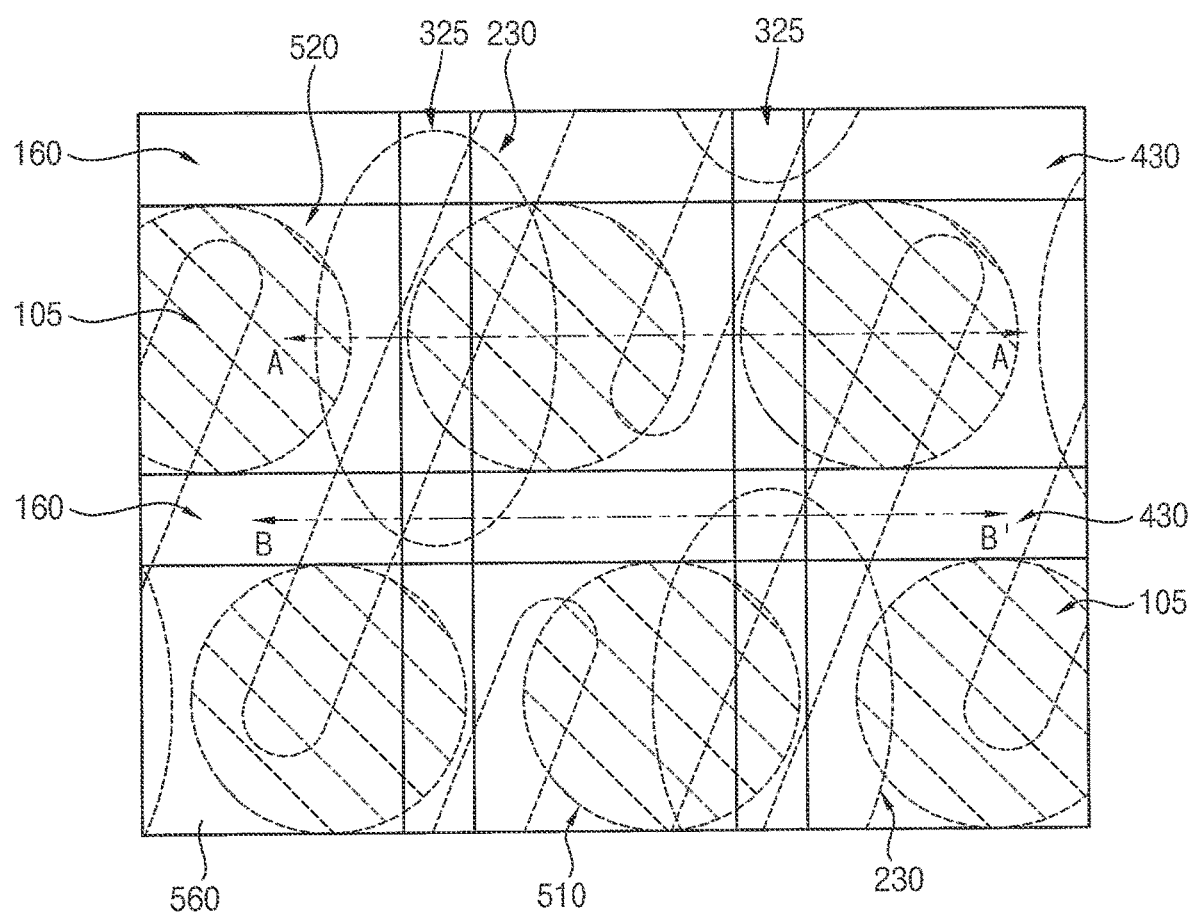
FIGS. 1 and 2 are a plan view and a cross-sectional view, respectively, illustrating a semiconductor device in accordance with example embodiments of the inventive concepts.
Figure 1:
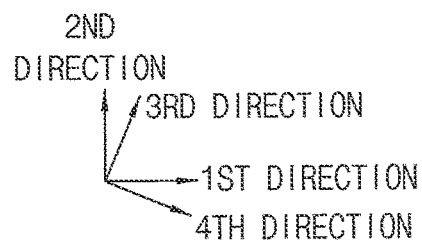
Figure 2:
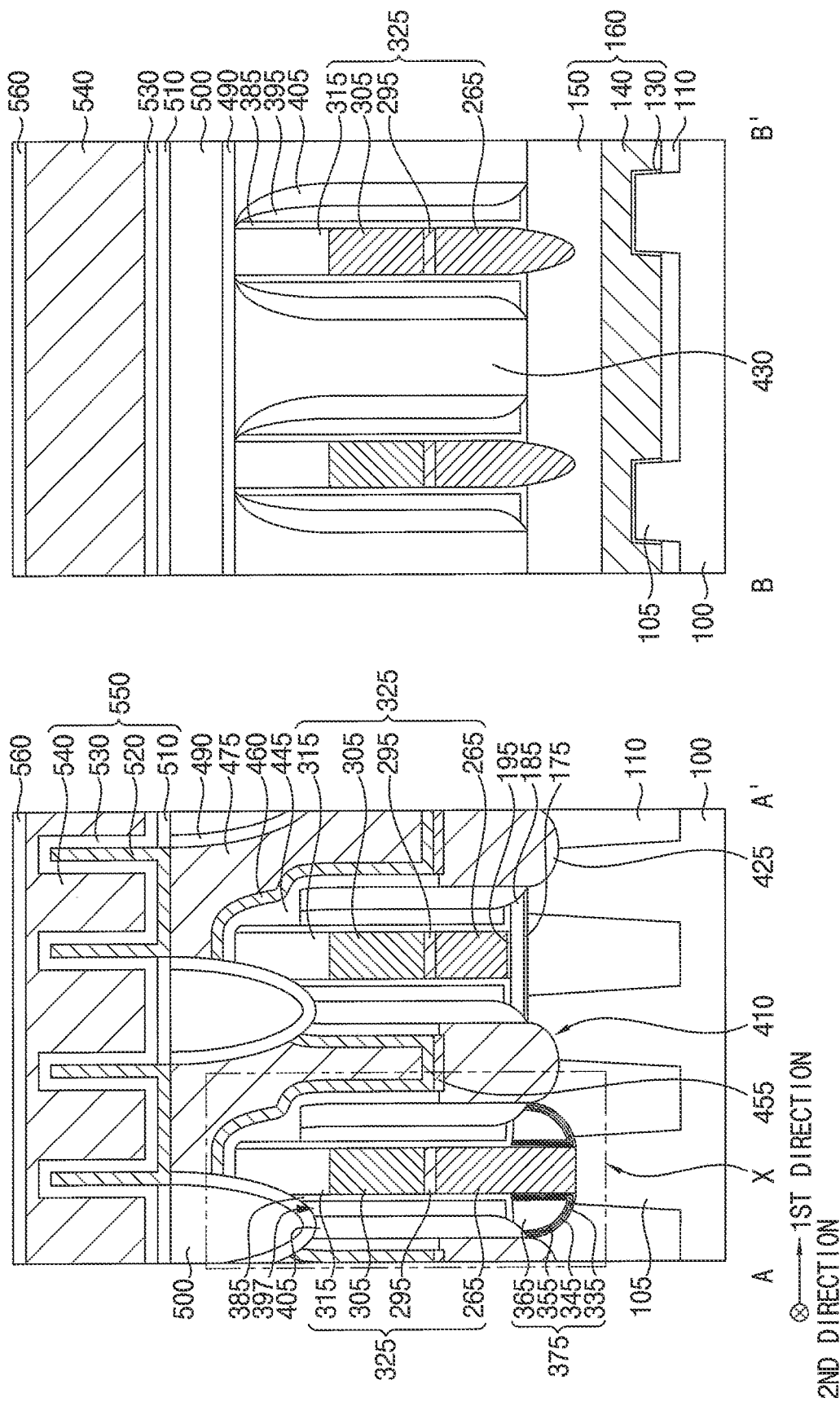

FIGS. 1 and 2 are a plan view and a cross-sectional view, respectively, illustrating a semiconductor device in accordance with example embodiments of the inventive concepts. FIG. 2 includes cross-section views taken along lines A-A' and B-B' of FIG. 1.

Hereinafter, in the specifications (and not necessarily in the claims), two directions substantially parallel to an upper surface of a substrate 100 and substantially perpendicular to each other may be referred to as first and second directions, respectively, a direction substantially parallel to the upper surface of the substrate 100 and having an acute angle with respect to the first and second directions may be referred to as a third direction, and a direction substantially parallel to the upper surface of the substrate 100 and substantially perpendicular to the third direction may be referred to as a fourth direction.

Referring to FIGS. 1 and 2, the semiconductor device may include a gate structure 160, a bit line structure 325, a first lower spacer structure 375, an upper spacer structure, a contact plug structure, and a capacitor 550. Additionally, the semiconductor device may include a second capping pattern 430, an insulation structure, an etch stop layer 510, and first to third insulating interlayers 490, 500 and 560.

For example, the substrate 100 may include silicon, germanium, silicon-germanium, or a III-V group compound semiconductor, such as GaP, GaAs, or GaSb. In some example embodiments, the substrate 100 may be a silicon-on-insulator (SOI) substrate or a germanium-on-insulator (GOI) substrate.

An isolation pattern 110 may be formed on the substrate 100, and an active pattern 105 of which a sidewall is covered by the isolation pattern 110 may be defined on the substrate 100. The isolation pattern 110 may include, for example, an oxide, e.g., silicon oxide. As used herein, "an element A covers an element B" (or similar language) may mean that the element A is on and overlaps the element B but does not necessarily mean that the element A covers the element B entirely. For example, the element A may cover only a portion of the element B.

In example embodiments, a plurality of active patterns 105 may be spaced apart from each other in each of the first and second directions, and each of the active patterns 105 may extend in the third direction to a certain length (e.g., a predetermined length). As used herein, "an element A extends in a direction X" (or similar language) may mean that the element A extends longitudinally in the direction X. In other words, the direction X is a length direction of the element A. In some embodiments, each of the active patterns 105 may extend in the third direction as illustrated in FIG. 1.

The gate structure 160 may extend in the first direction through upper portions of the active pattern 105 and the isolation pattern 110, and a plurality of gate structures 160 may be spaced apart from each other in the second direction. That is, the gate structure 160 may be buried at upper portions of the active pattern 105 and the isolation pattern 110. The gate structure 160 may include a gate insulation layer 130, a gate electrode 140 and a gate mask 150 sequentially stacked in a vertical direction that is substantially perpendicular to the upper surface of the substrate 100.

The gate insulation layer 130 may be formed on a surface of the active pattern 105, the gate electrode 140 may extend in the first direction on the gate insulation layer 130 and the isolation pattern 110, and the gate mask 150 may cover an upper surface of the gate electrode 140.

For example, the gate insulation layer 130 may include an oxide, e.g., silicon oxide, the gate electrode 140 may include a metal, e.g., tungsten, titanium, tantalum, etc., or a metal nitride, e.g., tungsten nitride, titanium nitride, tantalum nitride, etc., and the gate mask 150 may include a nitride, e.g., silicon nitride.

In example embodiments, the bit line structure 325 may extend in the second direction on the active pattern 105, the isolation pattern 110 and the gate structure 160, and a plurality of bit line structures 325 may be spaced apart from each other in the first direction. Each of the bit line structures 325 may contact a portion (e.g., a central or middle portion in the third direction) of an upper surface of the active pattern 105 and may contact portions of upper surfaces of the isolation pattern 110 and the gate structure 160 adjacent thereto in the second recess 230. A portion of the bit line structure 325 in the second recess 230 may have a bottom surface lower than those of other portions of the bit line structure 325 at an outside of the second recess 230, and the portion of the bit line structure 325 in the second recess 230 may be referred to as a lower portion thereof.

Figure 9:
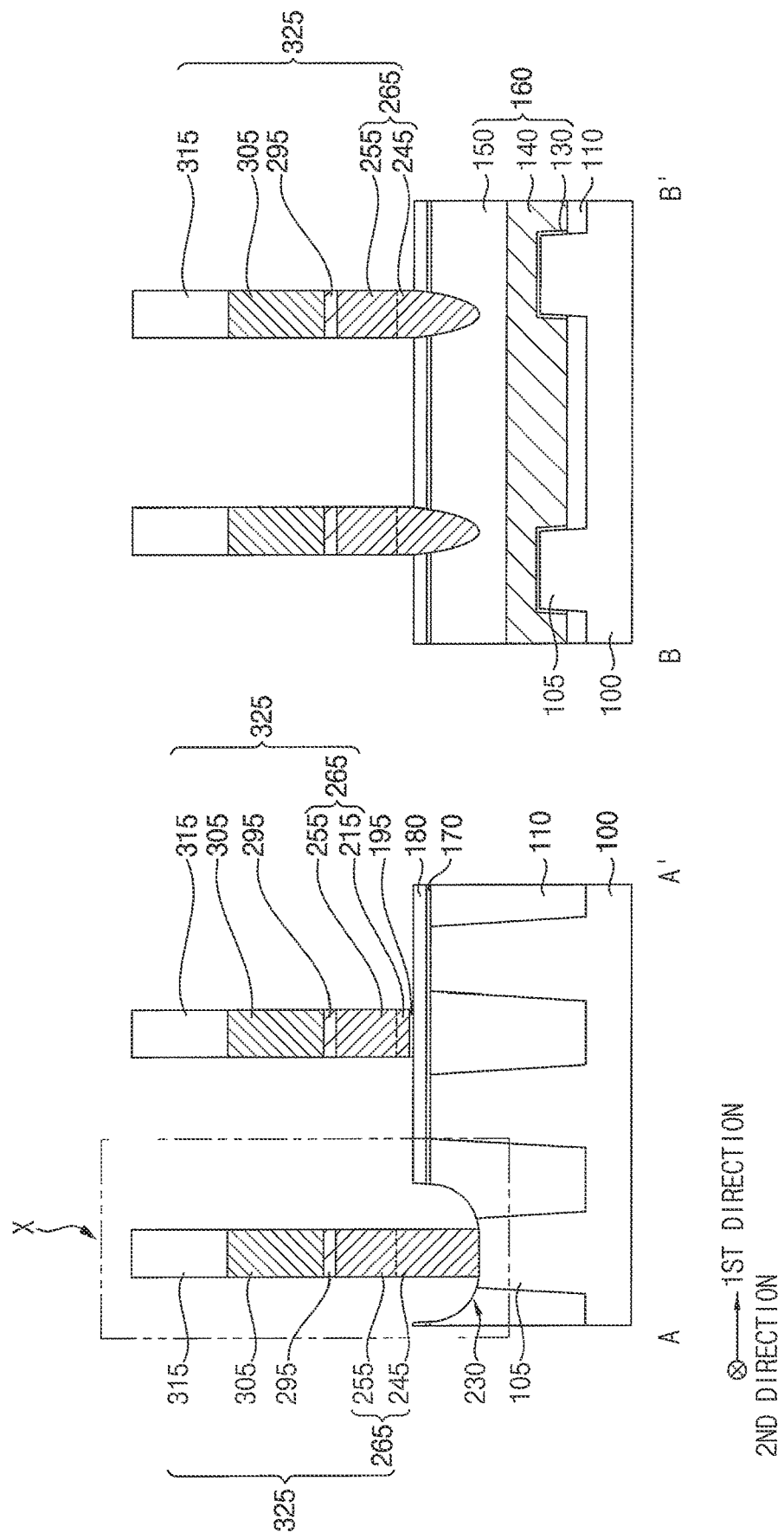

In example embodiments, the conductive structure 265 may include second and third conductive patterns 245 and 255 sequentially stacked (shown in, for example, FIG. 9) or first and third conductive patterns 215 and 255 sequentially stacked (shown in, for example, FIG. 9). A plurality of second conductive patterns 245 may be spaced apart from each other in each of the first and second directions. That is, most portion of each of the second conductive patterns 245 may be formed in the second recess 230, and a portion thereof may protrude from the second recess 230 upwardly. Thus, most portion of each of the second conductive patterns 245 may form the lower portion of the bit line structure 325. The first conductive pattern 215 may be formed at an outside of the second recess 230.

The third conductive pattern 255 may extend in the second direction on the first and second conductive patterns 215 and 245 disposed in the second direction. In example embodiments, each of the first to third conductive patterns 215, 245 and 255 may include, e.g., polysilicon doped with n-type impurities, and thus may be merged with each other. As used herein, "an element A is merged with an element B" (or similar language) may mean that the element A is physically connected to the element B.

Each of the diffusion barrier 295, the fourth conductive pattern 305 and the first capping pattern 315 may extend in the second direction on the third conductive pattern 255. For example, the diffusion barrier 295 may include a metal silicon nitride, e.g., titanium silicon nitride (TiSiN), the fourth conductive pattern 305 may include a metal, e.g., tungsten, copper, aluminum, titanium, tantalum, etc., and the first capping pattern 315 may include a nitride, e.g., silicon nitride.

In example embodiments, the first lower spacer structure 375 may be formed in the second recess 230 and may cover the lower portion of the bit line structure 325, that is, most portion of a sidewall in the first direction of the second conductive pattern 245 included in the conductive structure 265. The first lower spacer structure 375 may include a first lower spacer 335 contacting most portion of the sidewall of the second conductive pattern 245 and a bottom of the second recess 230, second and third lower spacers 345 and 355 sequentially stacked on the first lower spacer 335, and a fourth lower spacer 365 on the third lower spacer 355 and filling a remaining portion of the second recess 230. Thus, a sidewall of the fourth lower spacer 365 may be covered by the third lower spacer 355, a sidewall of the third lower spacer 355 may be covered by the second lower spacer 345, a sidewall of the second lower spacer 345 may be covered by the first lower spacer 335. In some embodiments, the first lower spacer 335 may separate the second, third, and fourth lower spacers 345, 355, 365 from the lower portion of the bit line structure 325, and each of the second, third, and fourth lower spacers 345, 355, 365 may be spaced apart from the lower portion of the bit line structure 325 as illustrated in FIG. 2. As used herein, "an element A fills an element B" (or similar language) may mean that the element A is in the element B but does not necessarily mean that the element A fills the element B entirely.

In example embodiments, the first lower spacer 335 may include a material not containing nitrogen, e.g., an oxide such as silicon oxide or silicon oxycarbide. The first lower spacer 335 may be devoid of nitrogen. The second and fourth lower spacers 345 and 365 may include a material different from the first lower spacer 335, e.g., a nitride such as silicon nitride, and the third spacer 355 may include a material having a high etching selectivity with respect to the fourth lower spacer 365, e.g., an oxide such as silicon oxide.

The upper spacer structure may be formed on each of opposite sidewalls of other portions of the bit line structure 325 except for the lower portion thereof, and thus may extend in the second direction. That is, the first lower spacer structure 375 and the upper spacer structure may be sequentially stacked in the vertical direction on the second recess 230.

In example embodiments, the upper spacer structure may include a first upper spacer 385, an air spacer 397, a third upper spacer 405 and a fourth upper spacer 445 sequentially stacked in the first direction on each of opposite sidewalls of the bit line structure 325. The opposite sidewalls of the bit line are spaced part from each other in the first direction. The first upper spacer 385 may contact each of the opposite sidewalls in the first direction of the bit line structure 325 except for the lower portion thereof, the air spacer 397 may contact a portion of an outer sidewall of the first upper spacer 385, the third upper spacer 405 may contact an outer sidewall of the air spacer 397, and the fourth upper spacer 445 may contact an upper surface of the first capping pattern 315, an upper surface and an upper outer sidewall of the first upper spacer 385, a top of the air spacer 397, and an upper surface and an upper outer sidewall of the third upper spacer 405. In some embodiments, the air spacer 397 is defined and surrounded by the first upper spacer 385 and the third upper spacer 405 as illustrated in FIG. 2.

However, in an area where the sidewall extending in the first direction of the bit line structure 325 is covered by the second capping pattern 430, the air spacer 397 and the third upper spacer 405 may be sequentially stacked in the first direction on the outer sidewall of the first upper spacer 385 and the fourth upper spacer 445 may not be formed.

In example embodiments, the first upper spacer 385 may have a cross-section in the first direction of an "L" shape. Thus, a lower surface of the first upper spacer 385 may contact an upper surface of the first lower spacer structure 375 and a bottom of the air spacer 397 may not contact the upper surface of the first lower spacer structure 375 due to the first upper spacer 385 on the second recess 230. A lower surface of the third upper spacer 405 may contact an edge of an upper surface of the first lower spacer structure 375.

In example embodiments, uppermost surfaces of the air spacer 397 and the third upper spacer 405 may be lower than an uppermost surface of the first upper spacer 385 and may be higher than an upper surface of the fourth conductive pattern 305. As used herein, "a surface V is higher than a surface W" (or similar language) may mean that the surface W is closer than the surface V to a substrate, and the surface W is lower than the surface V relative to the substrate.

In example embodiments, the first upper spacer 385 may include a material different from that of the first lower spacer 335, e.g., a nitride such as silicon nitride. The air spacer 397 may include, for example, air. The third upper spacer 405 may include a nitride, e.g., silicon nitride. The fourth upper spacer 445 may include a nitride, e.g., silicon nitride, or an oxide, e.g., silicon oxide. In some embodiments, the air spacer 397 may not include a liquid or solid material therein and may be a void or cavity. In some embodiments, the air spacer 397 may include an inert gas (e.g., argon gas) or may be a vacuum.

The insulation structure including first, second and third insulation patterns 175, 185 and 195 sequentially stacked in the vertical direction may be formed between the bit line structure 325 and portions of the active pattern 105 and the isolation pattern 110 at an outside of the second recess 230. The second insulation pattern 185 may contact a lower surface of the first upper spacer 385 having a cross-section of an "L" shape, and the third insulation pattern 195 may contact a lower surface of the bit line structure 325.

For example, each of the first and third insulation patterns 175 and 195 may include a nitride, e.g., silicon nitride, and the second insulation pattern 185 may include an oxide, e.g., silicon oxide.

The second capping pattern 430 may extend in the first direction to overlap the gate structure 160 in the vertical direction and may partially cover an outer sidewall of the upper spacer structure on the sidewall of the bit line structure 325 in the first direction. In example embodiments, a plurality of second capping patterns 430 may be spaced apart from each other in the second direction. For example, the second capping pattern 430 may include a nitride, e.g., silicon nitride.

The contact plug structure may include a lower contact plug 425, an ohmic contact pattern 455, a barrier layer 460 and an upper contact plug 475 sequentially stacked in the vertical direction.

The lower contact plug layer 425 may be formed on the third recess 410 on the active pattern 105 and the isolation pattern 110 between the bit line structures 325 neighboring in the first direction and the second capping patterns 430 neighboring in the second direction and may contact an outer sidewall of the third upper spacer 405 of the upper spacer structure and a sidewall of each of the second capping patterns 430. Thus, a plurality of lower contact plugs 425 may be formed to be spaced apart from each other in each of the first and second directions. In example embodiments, the lower contact plug 425 may contact each of opposite ends in the third direction of each of the active patterns 105. In example embodiments, an uppermost surface of the lower contact plug 425 may be lower than uppermost surfaces of the air spacer 397 and the third upper spacer 405.

For example, the lower contact plug 425 may include polysilicon doped with impurities. An air gap (not shown) may be formed in the lower contact plug 425.

The ohmic contact pattern 455 may be formed on the lower contact plug 425. The ohmic contact pattern 455 may include, e.g., cobalt silicide, nickel silicide, etc.

The barrier layer 460 may be formed on an upper surface of the ohmic contact pattern 455 and a sidewall and an upper surface of the fourth upper spacer 445. The barrier layer 460 may include a metal nitride, e.g., titanium nitride, tantalum nitride, tungsten nitride, etc.

The upper contact plug 475 may be formed on the barrier layer 460. An upper surface of the upper contact plug 475 may be higher than upper surfaces of the bit line structure 325 and the second capping pattern 430.

In example embodiments, a plurality of upper contact plugs 475 may be formed to be spaced apart from each other in the first and second directions and may be spaced apart from each other by the first and second insulating interlayers 490 and 500 sequentially stacked. The first insulating interlayer 490 may partially penetrate through an upper portion of the first capping pattern 315 of the bit line structure 325 and an upper portion of the upper spacer structure on the sidewall of the bit line structure 325. For example, the first insulating interlayer 490 may include an insulation material having low gap-filling characteristics, and the second insulating interlayer 500 may include a nitride, e.g., silicon nitride.

In example embodiments, the upper contact plugs 475 may be arranged in a honeycomb pattern in a plan view. Each of the upper contact plugs 475 may have a shape of a circle, an ellipse, or a polygon in a plan view. The upper contact plug 475 may include a low resistance metal, e.g., tungsten, aluminum, copper, etc.

The capacitor 550 may include a lower electrode 520, a dielectric layer 530 and an upper electrode 540 sequentially stacked on the upper contact plug 475. In some embodiments, the lower and upper electrodes 520 and 540 may include the same material, e.g., doped polysilicon and/or a metal. For example, the dielectric layer 530 may include silicon oxide, a metal oxide, and/or a nitride such as silicon nitride, a metal nitride, and the metal may include, e.g., aluminum, zirconium, titanium, hafnium, etc.

The etch stop layer 510 may be formed between the dielectric layer 530 and the first and second insulating interlayers 490 and 500, and may include, for example, a nitride, e.g., silicon nitride.

The third insulating interlayer 560 may be formed on the first and second insulating interlayers 490 and 500 and may cover the capacitor 550. The third insulating interlayer 560 may include, for example, an oxide, e.g., silicon oxide.

The conductive structure 265 in the bit line structure 325 of the semiconductor device may include, e.g., polysilicon doped with n-type impurities, and the first lower spacer 335 covering at least a portion of the sidewall of the conductive structure 265, that is, most portion of the sidewall of the second conductive pattern 245 (shown in, for example, FIG. 9) may not include nitrogen but include an oxide such as silicon oxide or silicon oxycarbide. If the first lower spacer 335 includes nitrogen, electrons in the conductive structure 265 may be trapped in the first lower spacer 335, and thus depletion regions may be generated at opposite sides of the conductive structure 265. Thus, a portion of the conductive structure 265 through which currents may flow may be reduced so that the currents may not easily flow in the conductive structure 265.

However, in example embodiments, the first lower spacer 335 may not include nitrogen, and thus electrons may not be trapped in the first lower spacer 335 so that currents may easily flow in the conductive structure 265.

FIGS. 3 to 20 are views illustrating a method of manufacturing a semiconductor device according to example embodiments of the inventive concepts. Specifically, FIGS. 3, 5, 8 and 16 are plan views, and each of FIGS. 4, 6-7, 9-15 and 17-20 are cross-sectional views. FIGS. 4, 6-7, 9, 15 and 17-20 includes cross-sections taken along lines A-A' and B-B' of a corresponding plan view, and FIGS. 10 to 14 are enlarged cross-sectional views of a region X of FIG. 9.

Figure 3:
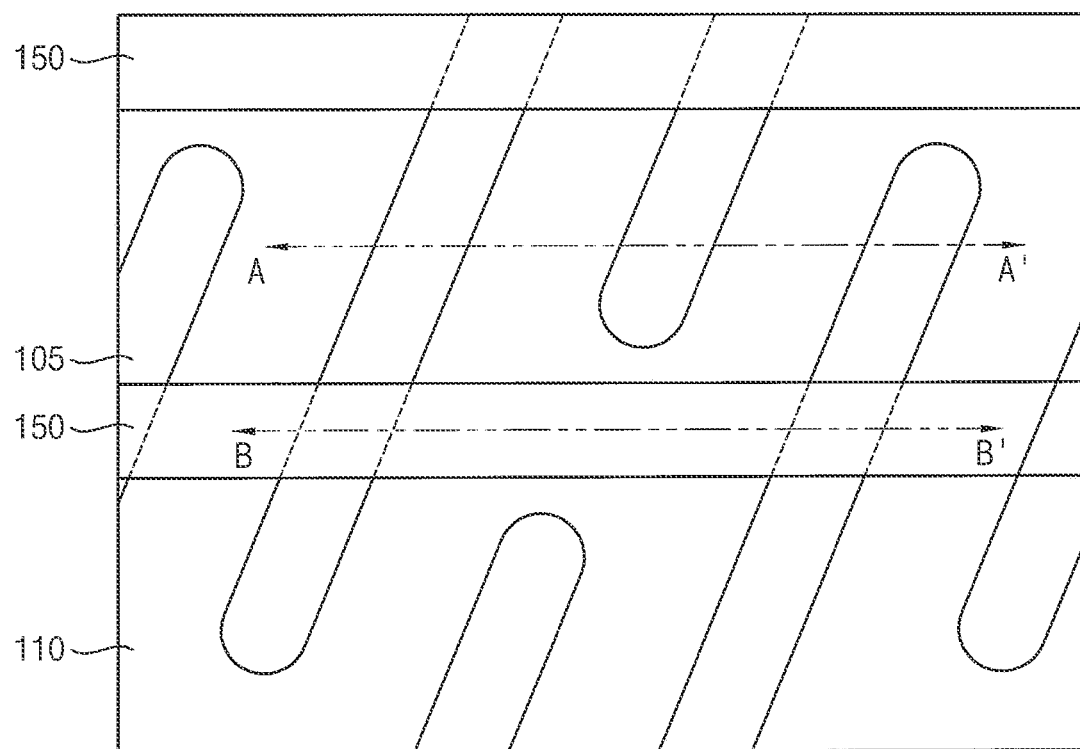
FIGS. 3 to 20 are views illustrating a method of manufacturing a semiconductor device according to example embodiments of the inventive concepts.
Figure 3:
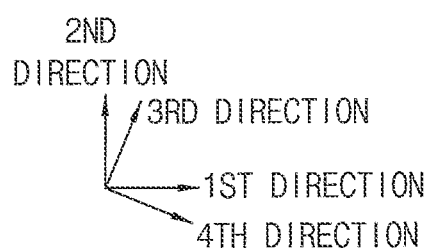
Figure 4:
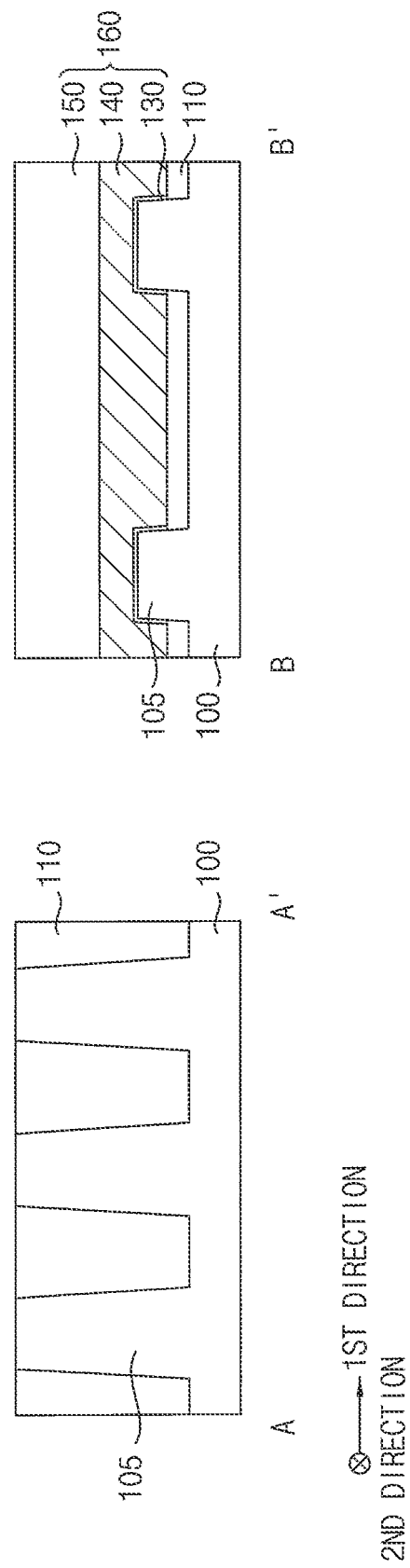

Referring to FIGS. 3 and 4, active patterns 105 may be formed on a substrate 100, and an isolation pattern 110 may be formed to cover sidewalls of the active patterns 105.

An ion implantation process may be performed on the substrate 100 to form an impurity region (not shown), and the active pattern 105 and the isolation pattern 110 may be partially etched to form a first recess extending in the first direction.

A gate structure 160 may be formed in the first recess. The gate structure 160 may include a gate insulation layer 130 on a surface of the active pattern 105 exposed by the first recess, a gate electrode 140 on the gate insulation layer 130 to fill a lower portion of the first recess, and a gate mask 150 on the gate electrode 140 to fill an upper portion of the first recess. The gate structure 160 may extend in the first direction, and a plurality of gate structures 160 may be spaced apart from each other in the second direction.

For example, the gate insulation layer 130 may be formed by performing a thermal oxidation process on the surface of the active pattern 105 exposed by the first recess.

Figure 5:
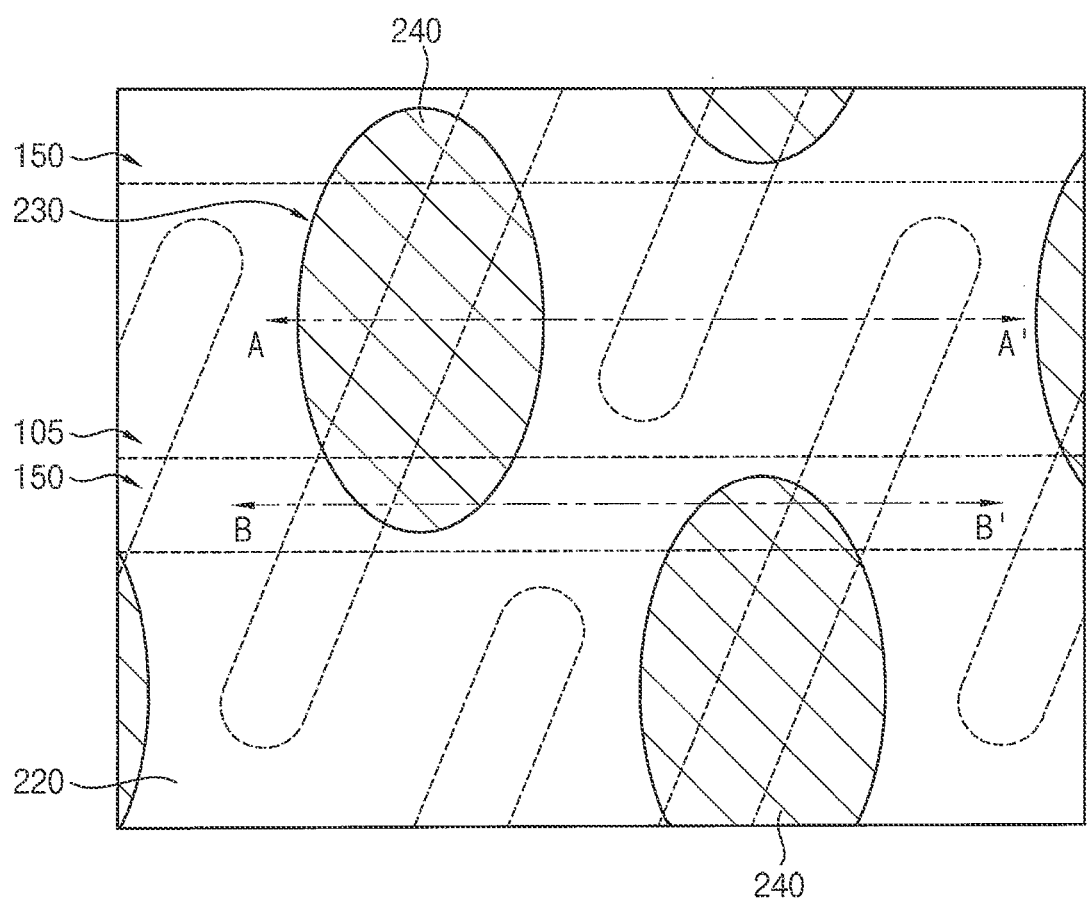
Figure 5:
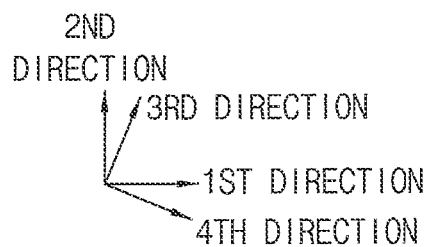
Figure 6:
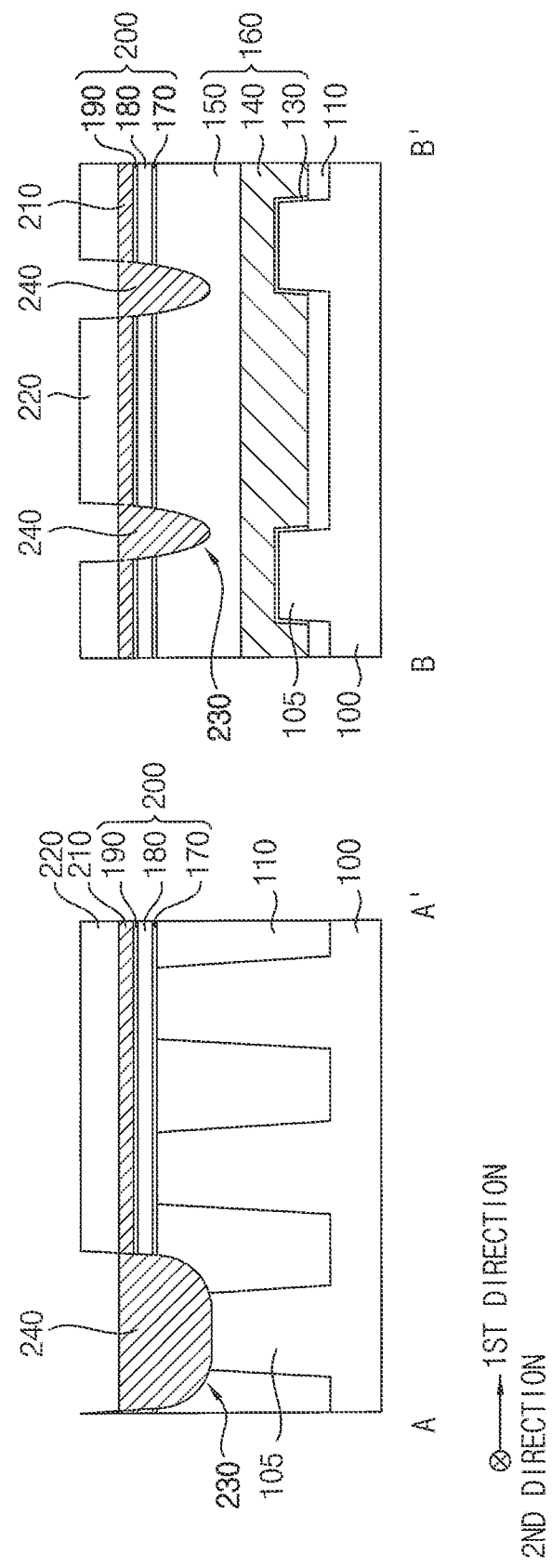

Referring to FIGS. 5 and 6, an insulation layer structure 200, a first conductive layer 210 and a first mask 220 may be sequentially formed on the substrate 100, and the first conductive layer 210 and the insulation layer structure 200 may be etched using the first mask 220 as an etching mask to form a first hole 230 exposing the active pattern 105.

In example embodiments, the insulation layer structure 200 may include first, second and third insulation layers 170, 180 and 190 sequentially stacked.

For example, the first conductive layer 210 may include, e.g., polysilicon doped with n-type impurities, and the first mask 220 may include a nitride, e.g., silicon nitride.

During the etching process, upper portions of the active pattern 105 and the isolation pattern 110 adjacent thereto exposed by the first hole 230, and an upper portion of the gate mask 150 may be also etched to form a second recess. That is, a bottom of the first hole 230 may be referred to as a second recess.

In example embodiments, the first hole 230 may expose a portion (e.g., a central or middle portion in the third direction) of an upper surface of each of the active patterns 105 extending in the third direction, and thus a plurality of first holes 230 may be formed to be spaced apart from each other in the first and second directions. In some embodiments, a middle portion of the active pattern 105 in the third direction (i.e., a length direction of the active pattern 105) may include an upper surface that is recessed toward the substrate 100 and defines the recess 230 as illustrated in FIGS. 5 and 6.

A second conductive layer 240 may be formed to fill the first hole 230.

In example embodiments, the second conductive layer 240 may be formed by forming a preliminary second conductive layer on the active pattern 105, the isolation pattern 110, the gate mask 150 and the first mask 220 to fill the first hole 230 and by removing an upper portion of the preliminary second conductive layer through, for example, a CMP process and/or an etch back process. Thus, the second conductive layer 240 may have an upper surface substantially coplanar with an upper surface of the first conductive layer 210. As used herein the term "and/or" includes any and all combinations of one or more of the associated listed items.

In example embodiments, a plurality of second conductive layers 240 may be spaced apart from each other in each of the first and second directions. The second conductive layer 240 may include, for example, polysilicon doped with n-type impurities, and may be merged to the first conductive layer 210.

Figure 7:
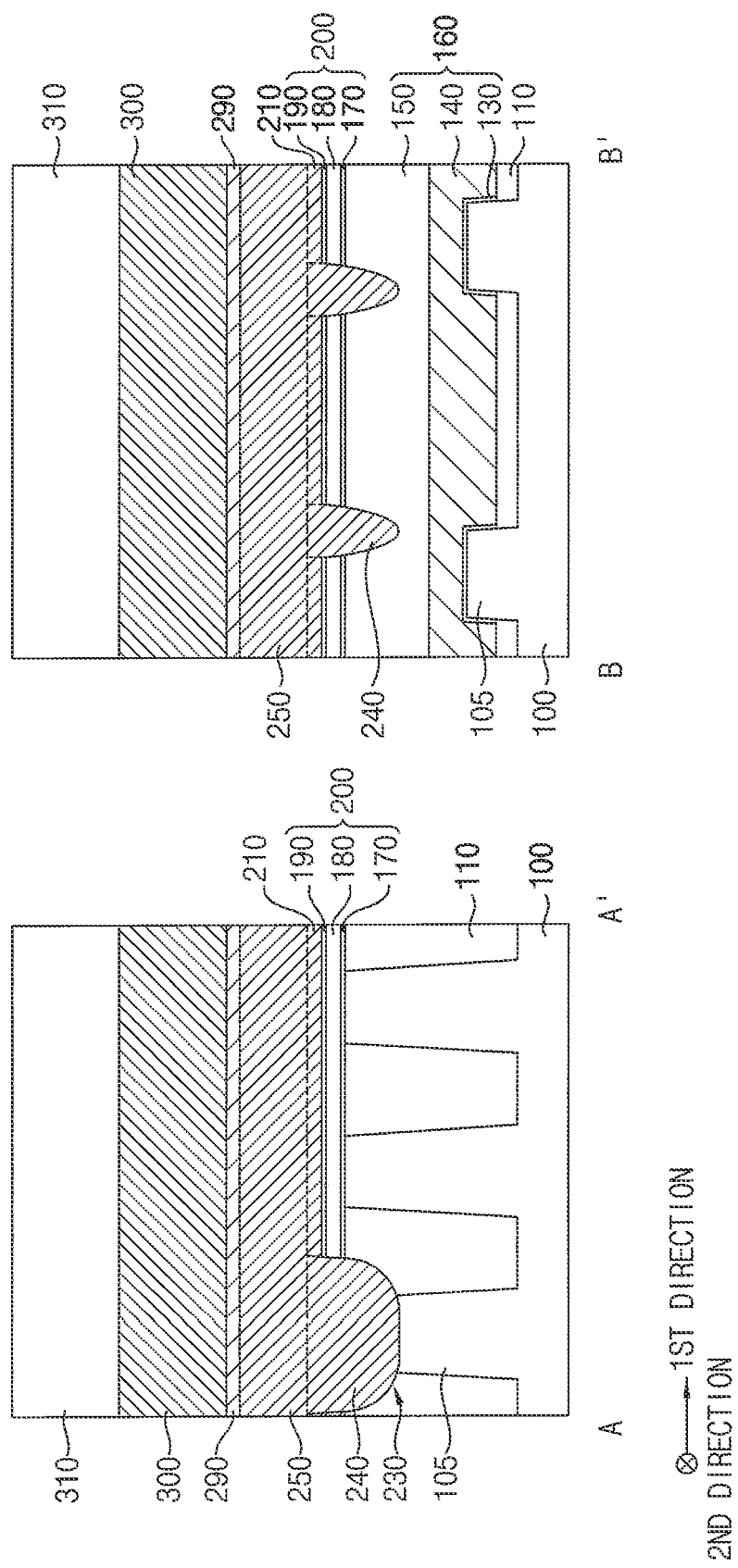

Referring to FIG. 7, after removing the first mask 220, a third conductive layer 250, a diffusion barrier layer 290, a fourth conductive layer 300 and a first capping layer 310 may be sequentially formed on the first and second conductive layers 210 and 240.

The third conductive layer 250 may include, for example, polysilicon doped with n-type impurities, and may be merged with the first and second conductive layers 210 and 240. The fourth conductive layer 300 may include, for example, a metal, e.g., tungsten.

Figure 8:
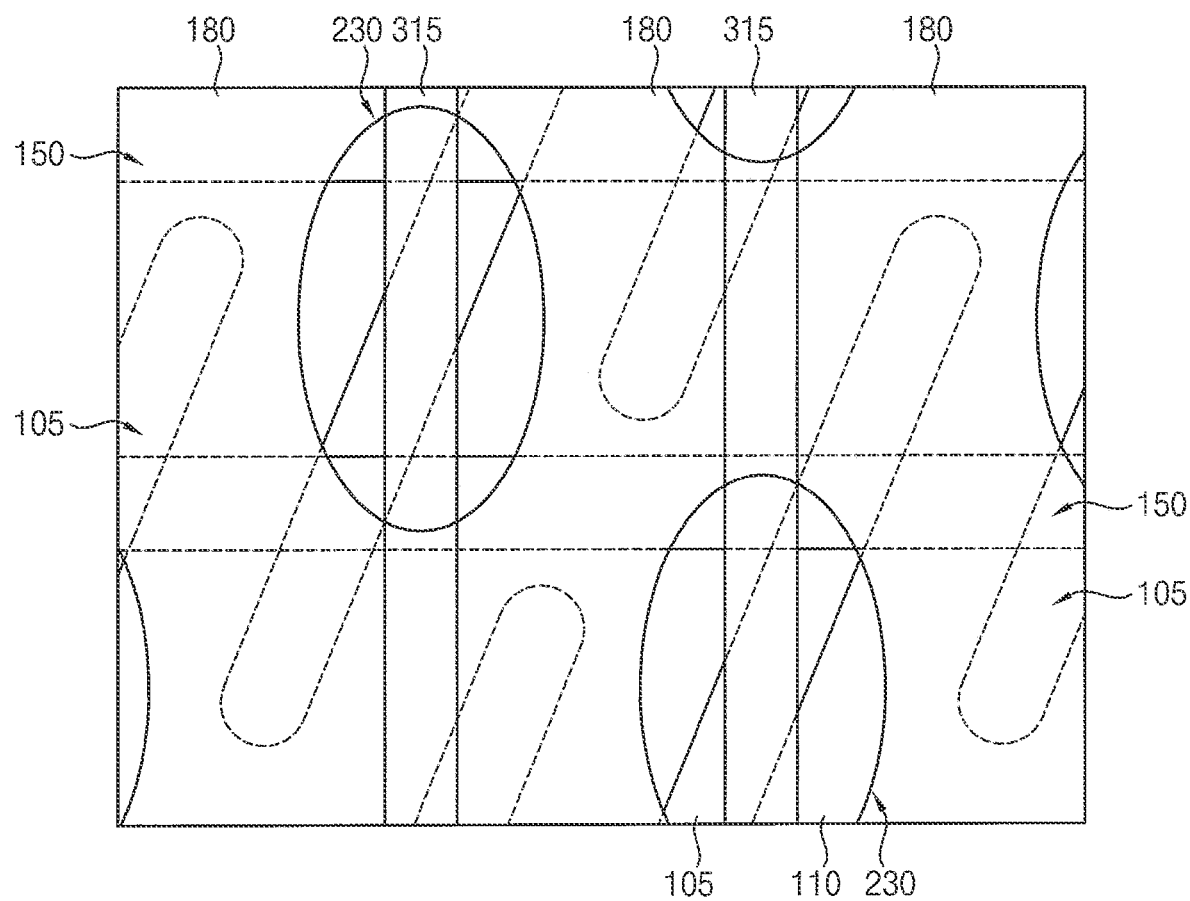
Figure 8:
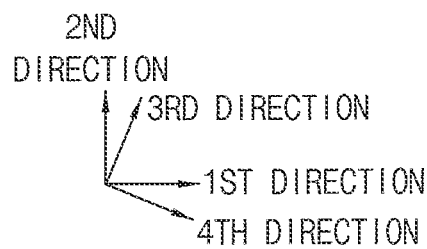

Referring to FIGS. 8 and 9, the first capping layer 310 may be patterned to form a first capping pattern 315, and the fourth conductive layer 300, the diffusion barrier layer 290, the third conductive layer 250, the first and second conductive layers 210 and 240, and the third insulation layer 190 may be sequentially etched using the first capping pattern 315 as an etching mask.

In example embodiments, the first capping pattern 315 may extend in the second direction on the substrate 100, and a plurality of first capping patterns 315 may be formed to be spaced apart from each other in the first direction.

By the etching process, a second conductive pattern 245, a third conductive pattern 255, a diffusion barrier 295, a fourth conductive pattern 305 and the first capping pattern 315 sequentially stacked may be formed on the active pattern 105, the isolation pattern 110 and the gate mask 150 in the first hole 230, and a third insulation pattern 195, a first conductive pattern 215, the third conductive pattern 255, the diffusion barrier 295, the fourth conductive pattern 305, and the first capping pattern 315 may be sequentially stacked on the second insulation layer 180 of the insulation layer structure 200 at an outside of the first hole 230.

As illustrated above, the first to third conductive layers 210, 240 and 250 may be merged with each other, and thus the second and third conductive patterns 245 and 255 sequentially stacked and the first and third conductive patterns 215 and 255 sequentially stacked may each form one conductive structure 265. Hereinafter, the conductive structure 265, the diffusion barrier 295, the fourth conductive pattern 305, and the first capping pattern 315 sequentially stacked may be referred to as a bit line structure 325.

In example embodiments, the bit line structure 325 may extend in the second direction on the substrate 100, and a plurality of bit line structures 325 may be spaced apart from each other in the first direction. Each of the bit line structures 325 may contact a portion (e.g., a central or middle portion in the third direction) of each of the active patterns 105 through the first hole 230, and thus may be electrically connected thereto.

Figure 10:
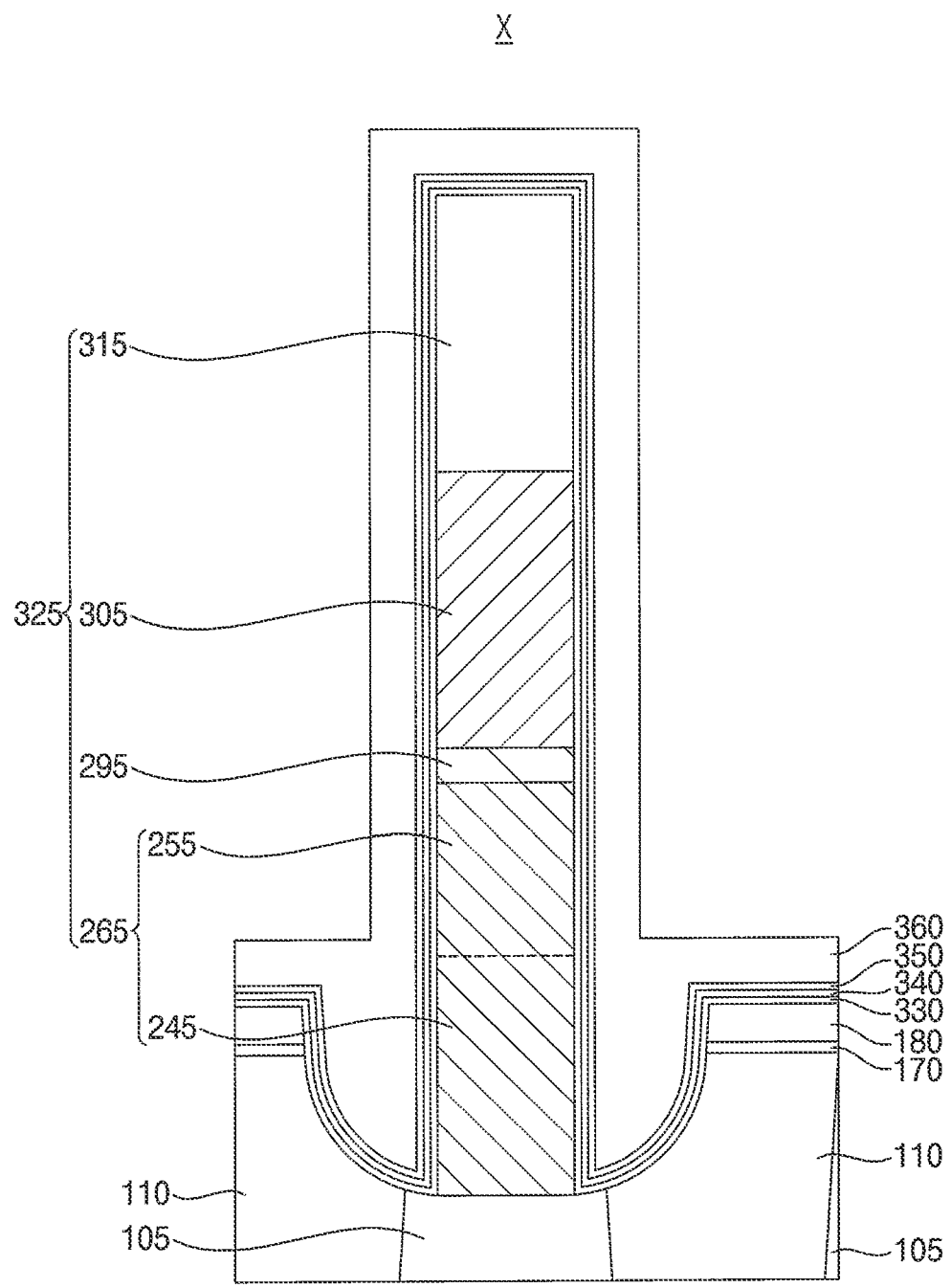

Referring to FIG. 10, a first spacer layer 330 may be formed on upper surfaces of the active pattern 105, the isolation pattern 110 and the gate mask 150 exposed by the first hole 230, a sidewall of the first hole 230, and an upper surface of the second insulation layer 180 to cover the bit line structure 325, second and third insulation layers 340 and 350 may be sequentially formed on the first spacer layer 330, and a fourth lower spacer layer 360 may be formed on the third lower spacer layer 350 to fill the first hole 230.

In example embodiments, the first lower spacer layer 330 may be formed by an atomic layer deposition (ALD) process. The first lower spacer layer 330 may include a material not containing nitrogen, e.g., silicon oxide, silicon oxycarbide, etc.

The second and fourth lower spacer layers 340 and 360 may include a material including nitride, e.g., silicon nitride, and the third lower spacer layer 350 may include a material having a high etching selectivity with respect to the fourth lower spacer layer 360, e.g., an oxide such as silicon oxide.

Figure 11:
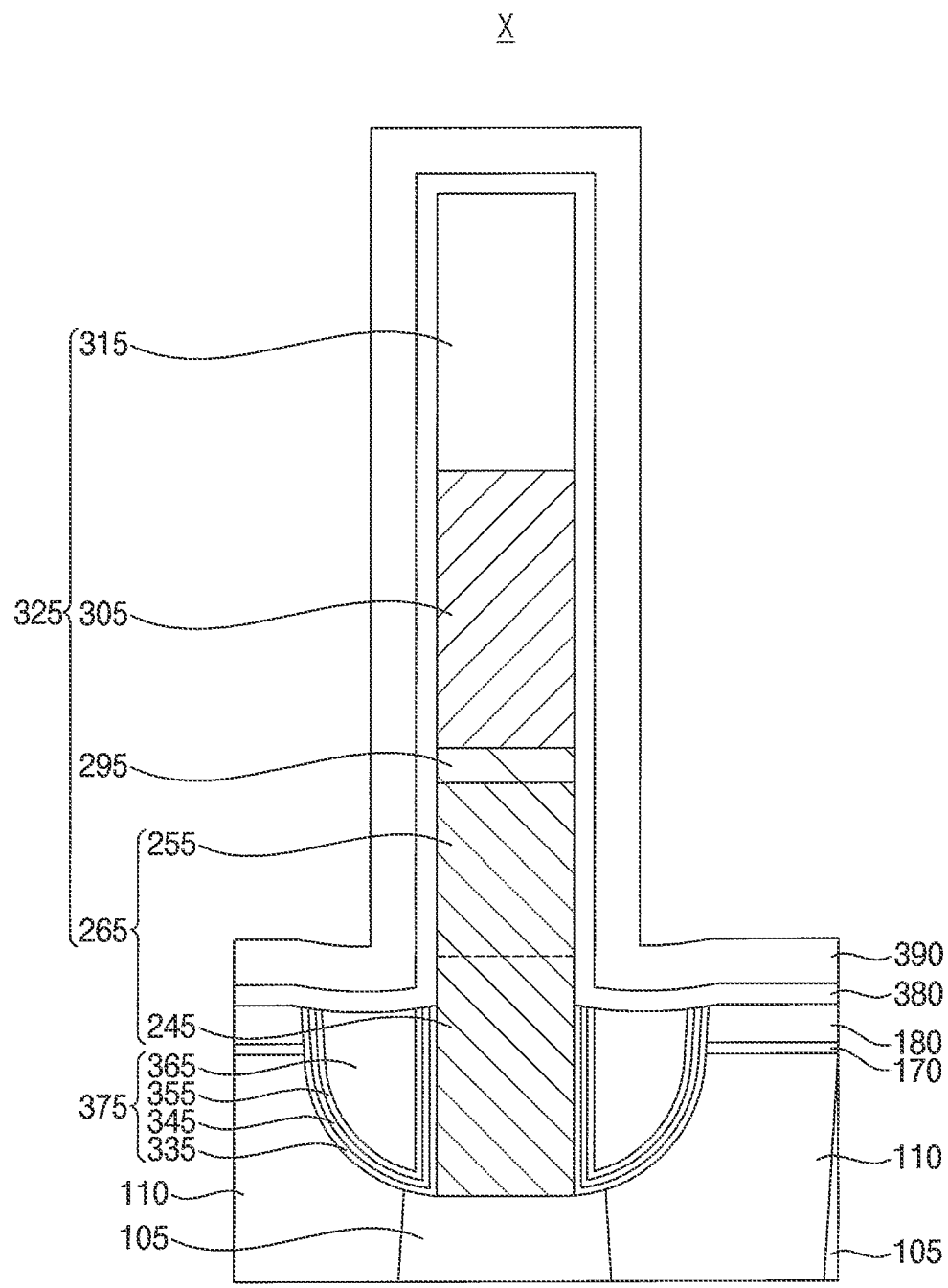

Referring to FIG. 11, first and second wet etching processes may be performed to partially etch the first to fourth lower spacer layers 330, 340, 350 and 360.

In example embodiments, the first wet etching process may be performed using phosphoric acid (H₃PO₄) and SC1 solution. Thus, the fourth lower spacer layer 360 may be etched, and the third lower spacer layer 350 may serve as a stopper for the first wet etching process. The third lower spacer layer 350 may be partially etched by the SC1 solution, however, the second lower spacer layer 340 is formed under the third lower spacer layer 350, and thus the sidewall of the bit line structure 325 may not be exposed by the first wet etching process.

If the first wet etching process is performed after forming the third and fourth lower spacer layers 350 and 360 without forming the first and second lower spacer layers 330 and 340, the third lower spacer layer 350 may be removed by the SC1 solution to expose the sidewall of the bit line structure 325, and the fourth conductive pattern 305 including a metal may be also damaged.

Additionally, during a high temperature process for forming the fourth lower spacer layer 360 on the sidewall of the bit line structure 325 having the third lower spacer layer 350 thereon, the metal such as tungsten included in the fourth conductive pattern 305 may move through the third lower spacer layer 350 including an oxide to the fourth lower spacer layer 360 including a nitride, and when an upper portion of the fourth lower spacer layer 360 is removed by the first wet etching process, the metal included in the fourth conductive pattern 305 may corrupt a chamber in which the first wet etching process is performed.

However, in example embodiments, the first lower spacer layer 330 including an oxide and the second lower spacer layer 340 including a nitride may be stacked between the sidewall of the bit line structure 325 and the third lower spacer layer 350, and the second lower spacer layer 340 including a nitride may prevent the sidewall of the bit line structure 325 from being exposed by the SC1 solution. Additionally, the first lower spacer layer 330 and the second lower spacer layer 340 may prevent the metal included in the fourth conductive pattern 305 from moving to the fourth lower spacer layer 360.

The second wet etching process may be performed using hydrogen fluoride (HF), and thus the first to third lower spacer layers 330, 340 and 350 may be etched.

As the first and second wet etching processes are performed, the first to fourth lower spacer layers 330, 340, 350 and 360 may remain only in the first hole 230 and may form first to fourth lower spacers 335, 345, 355 and 365, respectively. The first to third lower spacers 335, 345 and 355 sequentially stacked on an inner wall of the first hole 230 and the fourth lower spacer 365 on the third lower spacer 355 and filling a remaining portion of the first hole 230 may form a first lower spacer structure 375, and a sidewall of a lower portion of the bit line structure 325 in the first hole 230 may be covered by the first lower spacer structure 375.

A first upper spacer layer 380 may be formed on the first lower spacer structure 375 and the second insulation layer 180 to cover a sidewall of other portions of the bit line structure 325 not covered by the first lower spacer structure 375 and a sidewall of the third insulation pattern 195 under a portion of the bit line structure 325 at an outside of the first hole 230, and a second upper spacer layer 390 may be formed on the first upper spacer layer 380.

For example, the first upper spacer layer 380 may include a nitride, e.g., silicon nitride, and the second spacer layer 390 may include a material having a high etching selectivity with respect to the first upper spacer layer 380, e.g., an oxide such as silicon oxide.

Figure 12:
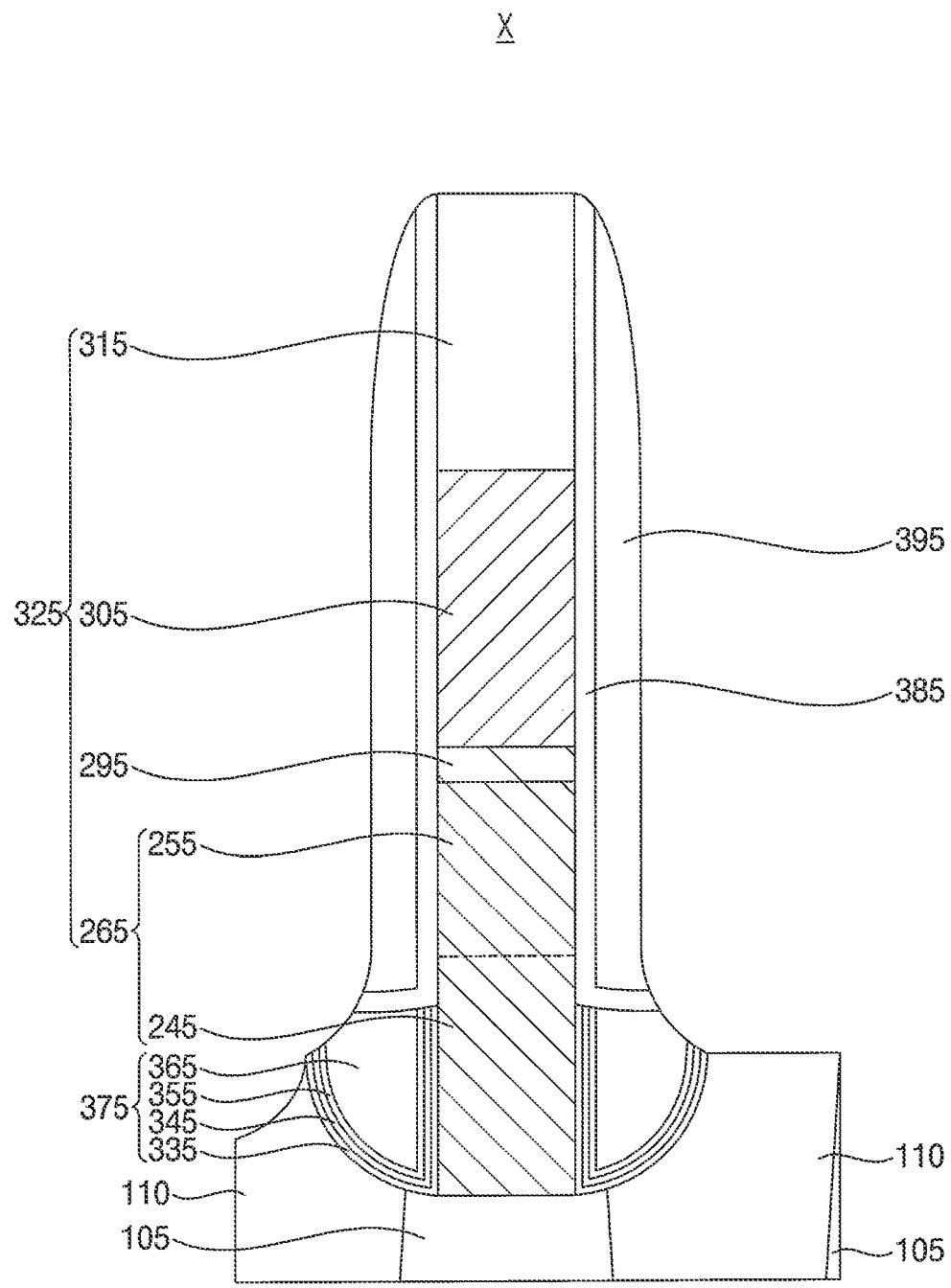

Referring to FIG. 12, the first and second upper spacer layers 380 and 390 may be anisotropically etched to form first and second upper spacers 385 and 395, respectively, covering an upper sidewall of the bit line structure 325 on the first hole 230 and a sidewall of the portion of the bit line structure 325 at an outside of the first hole 230.

Figure 14:
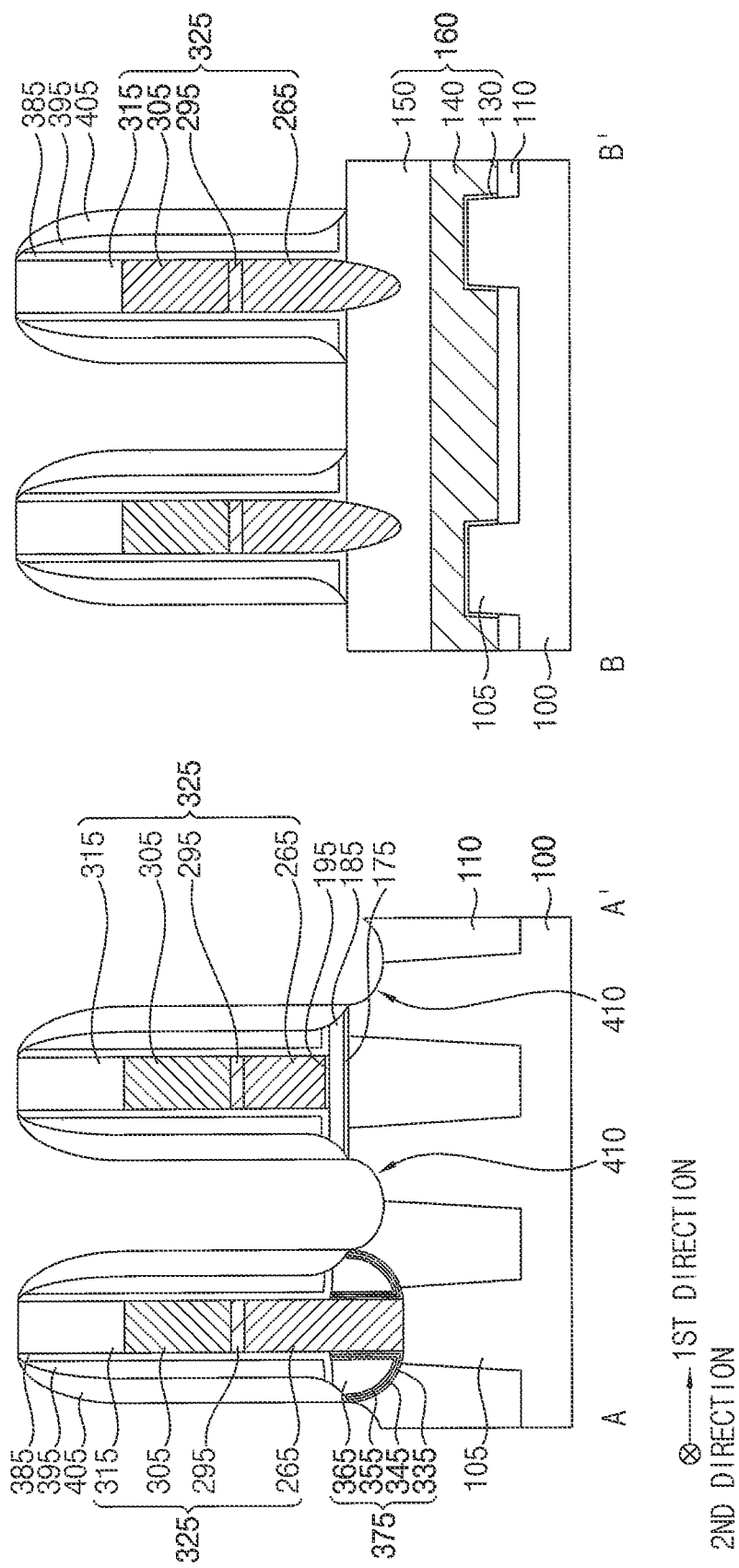

Referring to FIG. 14, the first and second insulation layers 170 and 180 may be also etched, and first and second insulation patterns 175 and 185 may remain under the portion of the bit line structure 325 at an outside of the first hole 230 and the first and second upper spacers 385 and 395 on the sidewall thereof.

Accordingly, upper surfaces of the active pattern 105 and the isolation pattern 110 may be partially exposed, and the first to third insulation patterns 175, 185 and 195 sequentially stacked between the bit line structure 325 and the substrate 100 may form an insulation structure.

During the etching process, an edge upper portion of the first lower spacer structure 375 may be partially etched.

In example embodiments, the first upper spacer 385 may be formed on the sidewall of the bit line structure 325 and an upper surface of the first lower spacer structure 375 on the first hole 230 and may have a cross-section in the first direction of an "L" shape. Additionally, the first upper spacer 385 may be formed on the sidewall of the bit line structure 325, a sidewall of the third insulation pattern 195 and an upper surface of the second insulation pattern 185 at an outside of the first hole 230 and may have a cross-section in the first direction of an "L" shape. In some embodiments, the first upper spacer 385 may include a vertical portion extending in the vertical direction and a horizontal portion protruding from a lower end of the vertical portion and extending in the first direction as illustrated in FIG. 12.

Figure 13:
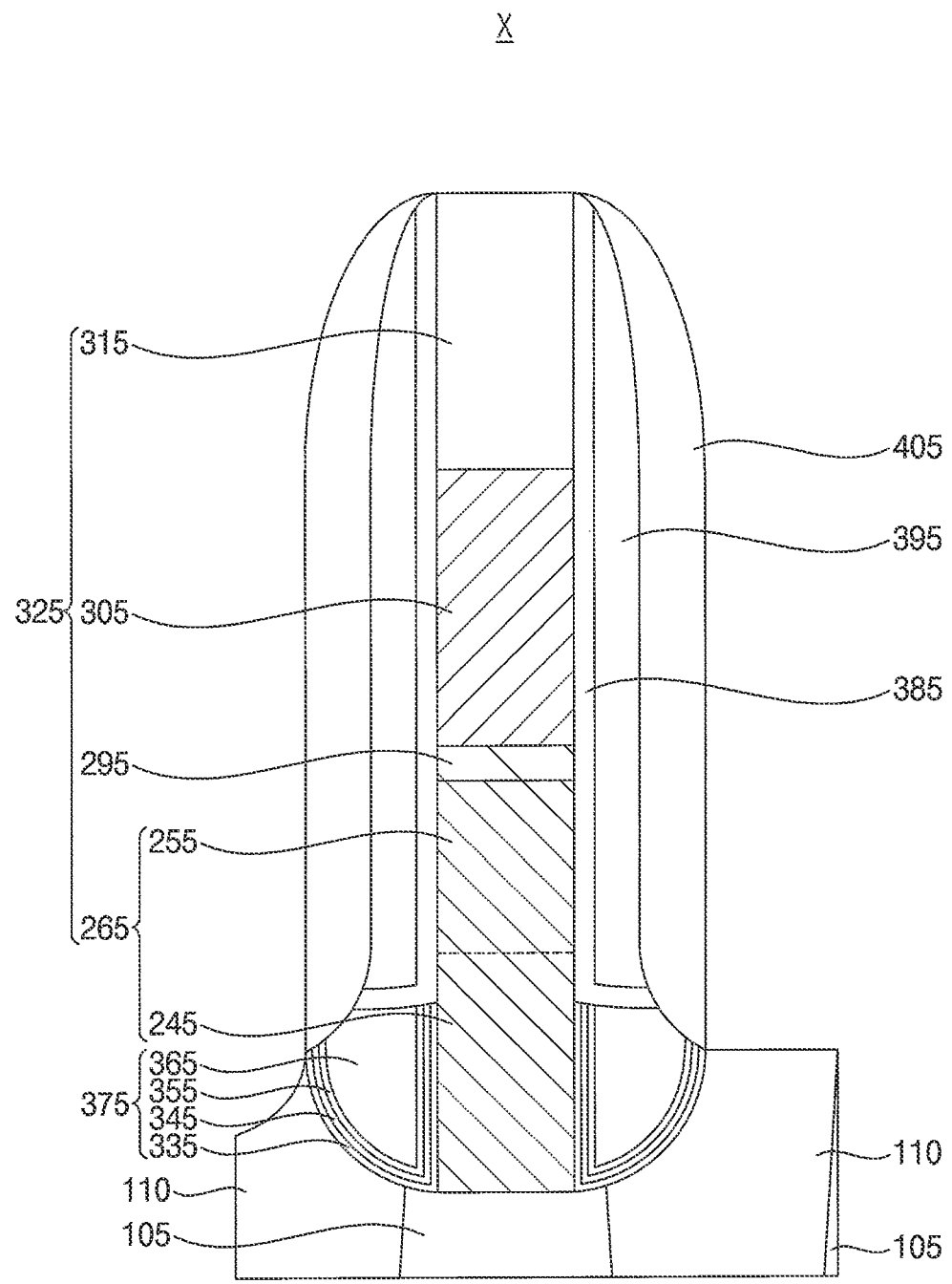

Referring to FIG. 13, a third upper spacer layer may be formed on the bit line structure 325, the first and second upper spacers 385 and 395, the first and second insulation patterns 175 and 185, the active pattern 105 and the isolation pattern 110, and may be anisotropically etched to form a third upper spacer 405 covering sidewalls of the first and second upper spacers 385 and 395 and an edge upper surface of the first lower spacer structure 375.

For example, the third upper spacer 405 may include a material having a high etching selectivity with respect to the second upper spacer 395, e.g., a nitride such as silicon nitride.

The first to third upper spacers 385, 395 and 405 sequentially stacked in a horizontal direction substantially parallel to an upper surface of the substrate 100 on a sidewall of an upper portion of the bit line structure 325 on the first hole 230 and a sidewall of the portion of the bit line structure 325 at an outside of the first hole 230 may be referred to as a preliminary upper spacer structure.

Referring to FIG. 14, an upper portion of the active pattern 105 and an upper portion of the isolation pattern 110 adjacent thereto may be partially removed by an etching process using the bit line structure 325, the first to third insulation patterns 175, 185 and 195 and the preliminary upper spacer structure as an etching mask to form a third recess 410.

Figure 15:
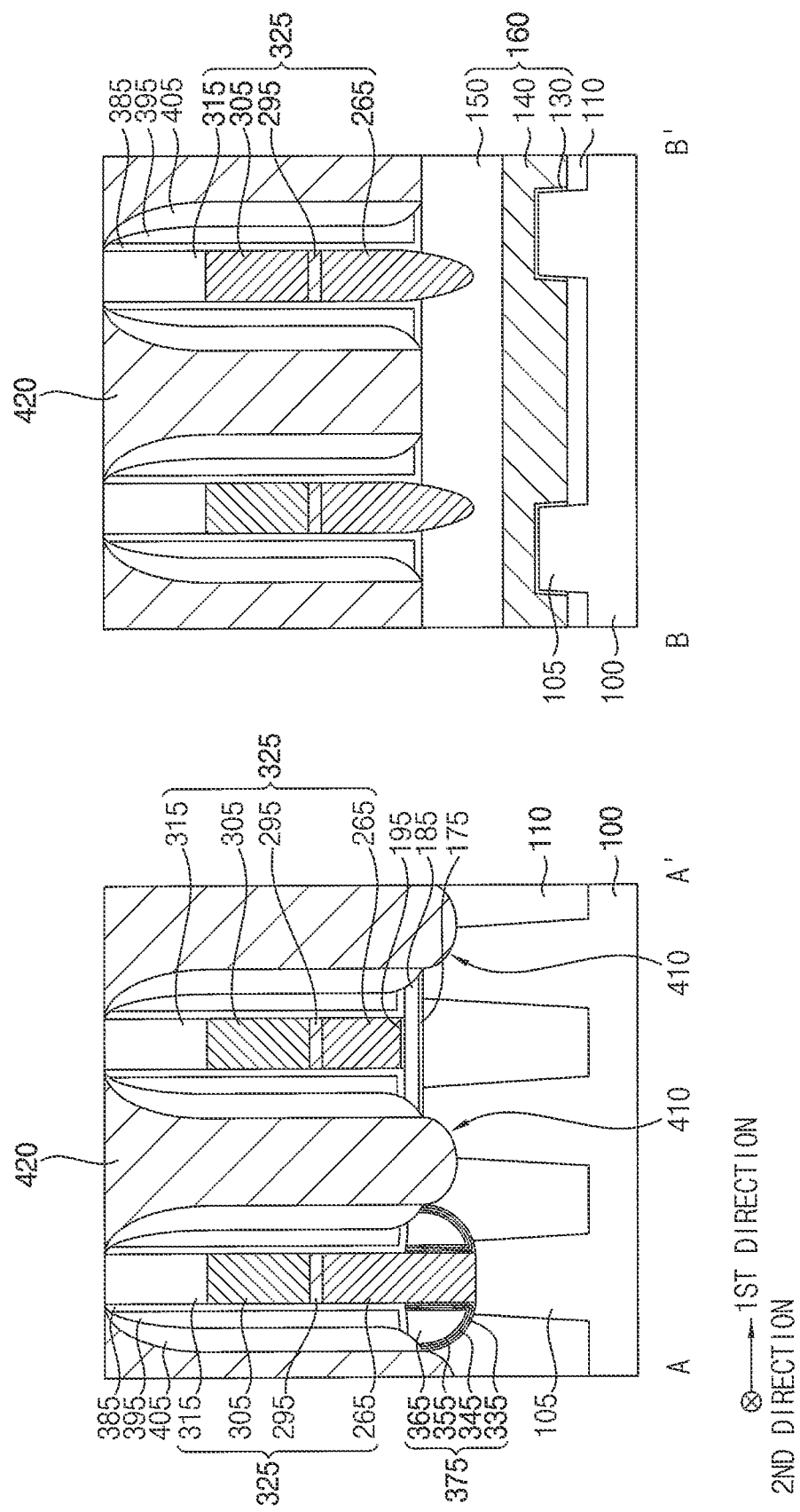

Referring to FIG. 15, a lower contact plug layer 420 may be formed to fill the third recess 410 on the substrate 100 and a space between the bit line structures 325, and an upper portion of the lower contact plug layer 420 may be planarized until an upper surface of the first capping pattern 315 is exposed.

In example embodiments, the lower contact plug layer 420 may extend in the second direction, and a plurality of lower contact plug layers 420 may be formed to be spaced apart from each other in the first direction by the bit line structures 325.

Figure 16:
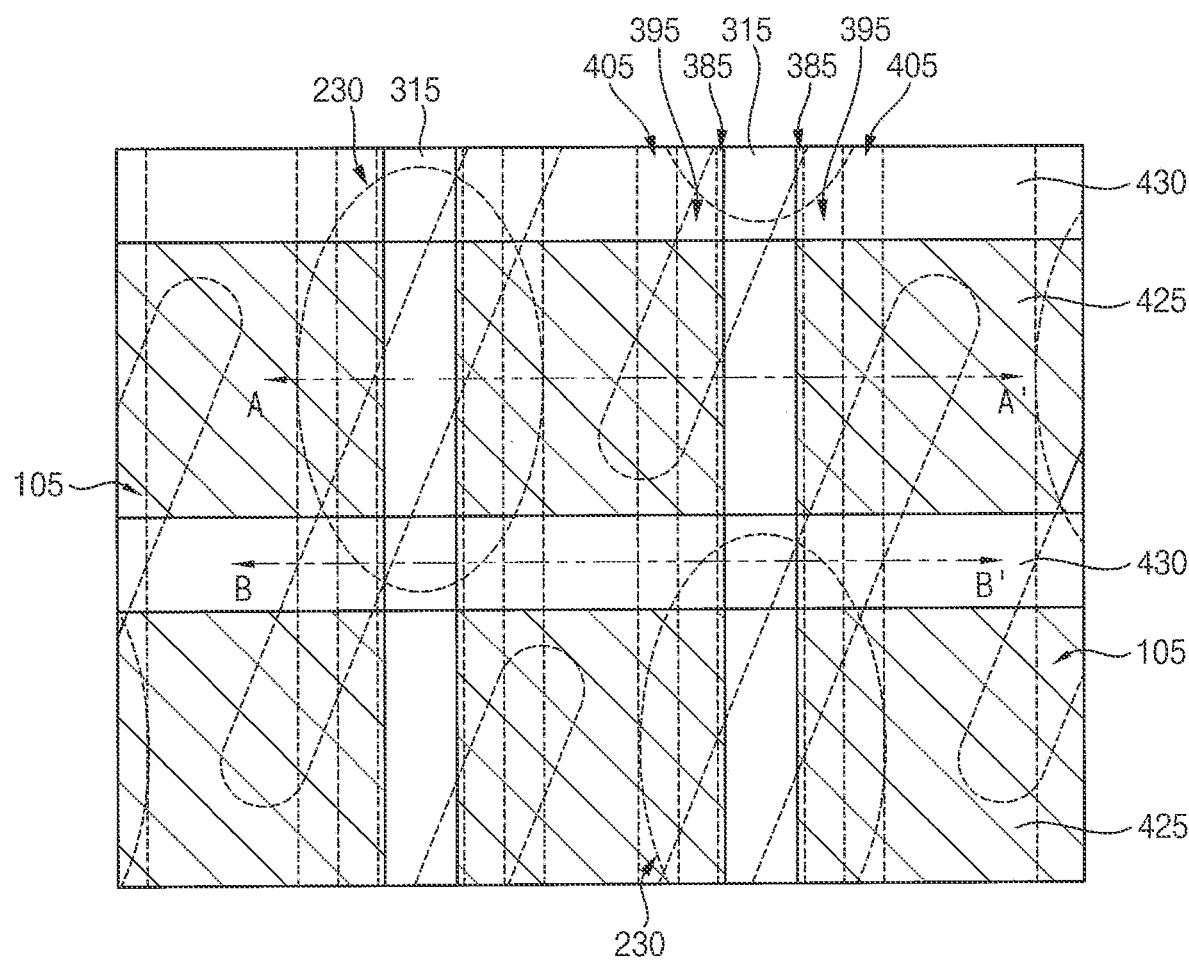
Figure 16:
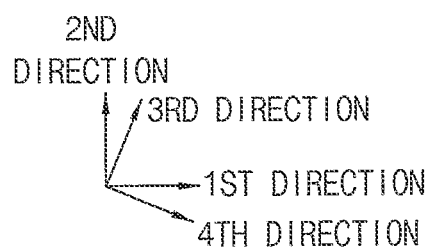
Figure 17:
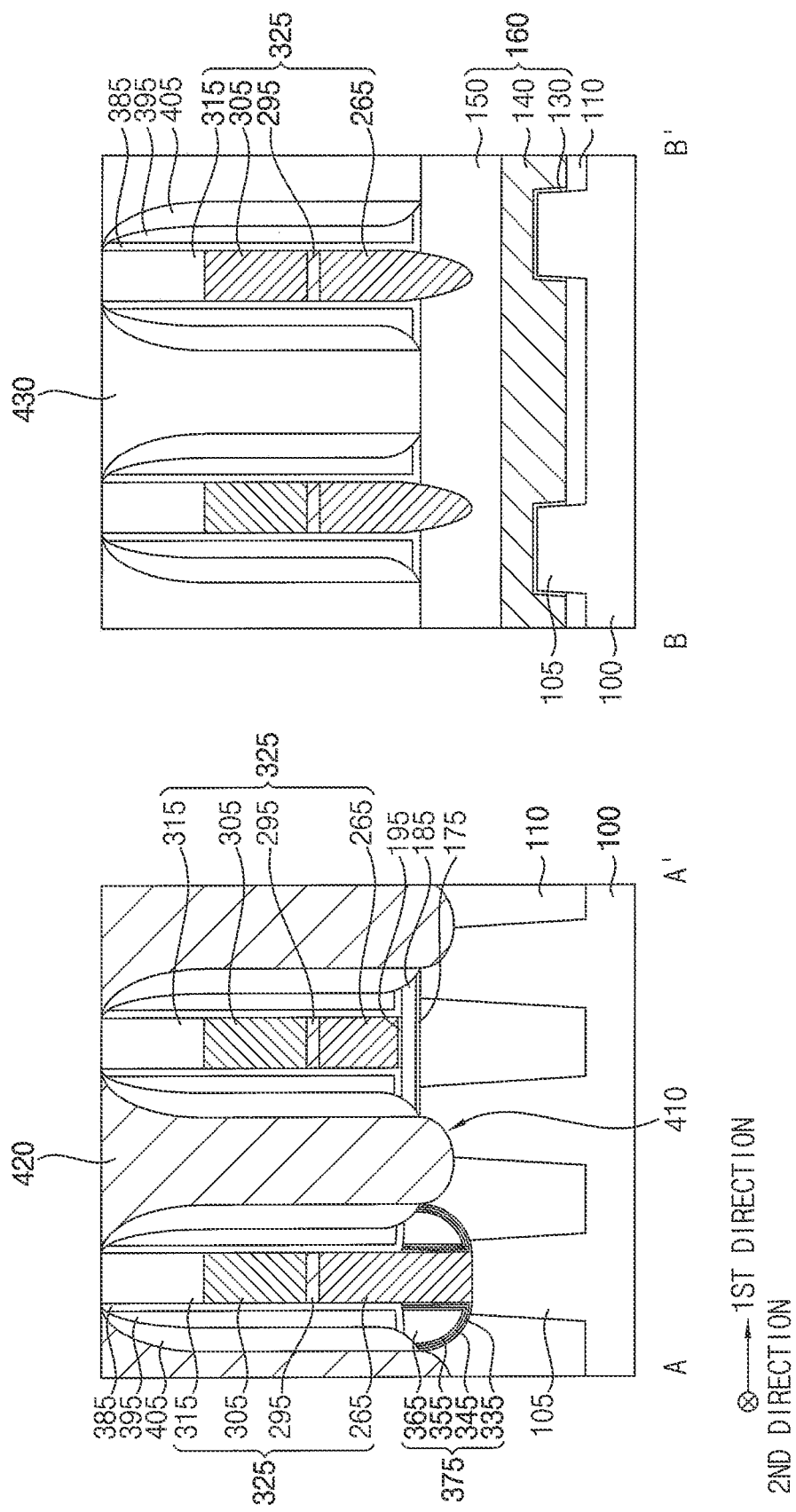

Referring to FIGS. 16 and 17, a second mask (not shown) including first openings, each of which may extend in the first direction, spaced apart from each other in the second direction may be formed on the first capping pattern 315 and the lower contact plug layer 420, and the lower contact plug layer 420 may be etched using the second mask as an etching mask.

In example embodiments, each of the first openings may overlap the gate structure 160 in a vertical direction substantially perpendicular to the upper surface of the substrate 100. By the etching process, a second opening may be formed to expose the upper surface of the gate mask 150 of the gate structure 160 between the bit line structures 325 on the substrate 100.

After removing the second mask, a second capping pattern 430 may be formed on the substrate 100 to fill the second opening. The second capping pattern 430 may extend in the first direction between the bit line structures 325, and a plurality of second capping patterns 430 may be formed in the second direction.

Thus, the lower contact plug layer 420 extending in the second direction between the bit line structures 325 may be divided into a plurality of lower contact plugs 425 spaced apart from each other in the second direction by the second capping patterns 430. Each of the lower contact plugs 425 may contact a corresponding one of opposite ends in the third direction of a corresponding one of the active patterns 105 and may be electrically connected thereto.

Figure 18:
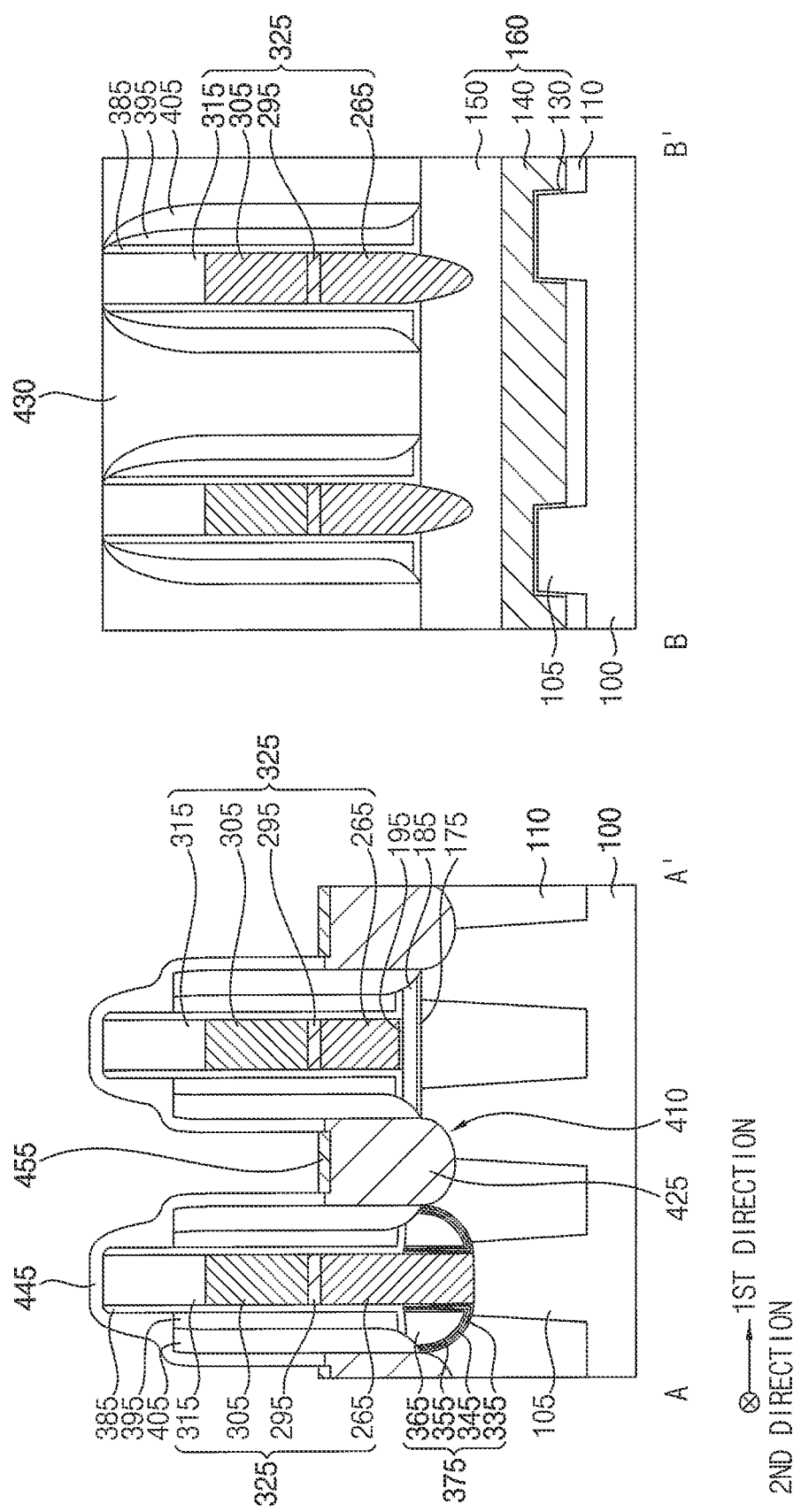

Referring to FIG. 18, an upper portion of the lower contact plug 425 may be removed to expose an upper portion of the preliminary spacer structure on the sidewall of the bit line structure 325, and upper portions of the second and third upper spacers 395 and 405 of the exposed preliminary spacer structure may be removed. Thus, an upper sidewall of the first upper spacer 385 may be exposed.

An upper portion of the lower contact plug 425 may be further removed by, e.g., an etch back process. Thus, the upper surface of the lower contact plug 425 may be lower than uppermost surfaces of the second and third upper spacers 395 and 405.

A fourth upper spacer layer may be formed on the bit line structure 325, the preliminary upper spacer structure, the second capping pattern 430, and the lower contact plug 425, and may be anisotropically etched so that a fourth upper spacer 445 may be formed to cover the preliminary upper spacer structure on each of opposite sidewalls of the bit line structure 325 in the first direction and that an upper surface of the lower contact plug 425 may be exposed.

An ohmic contact pattern 455 may be formed on the exposed upper surface of the lower contact plug 425. In example embodiments, the ohmic contact pattern 455 may be formed by forming a metal layer on the lower contact plug 425, the fourth upper spacer 445, and the first and second capping patterns 315 and 430, thermally treating the metal layer, and removing an unreacted portion of the metal layer.

Figure 19:
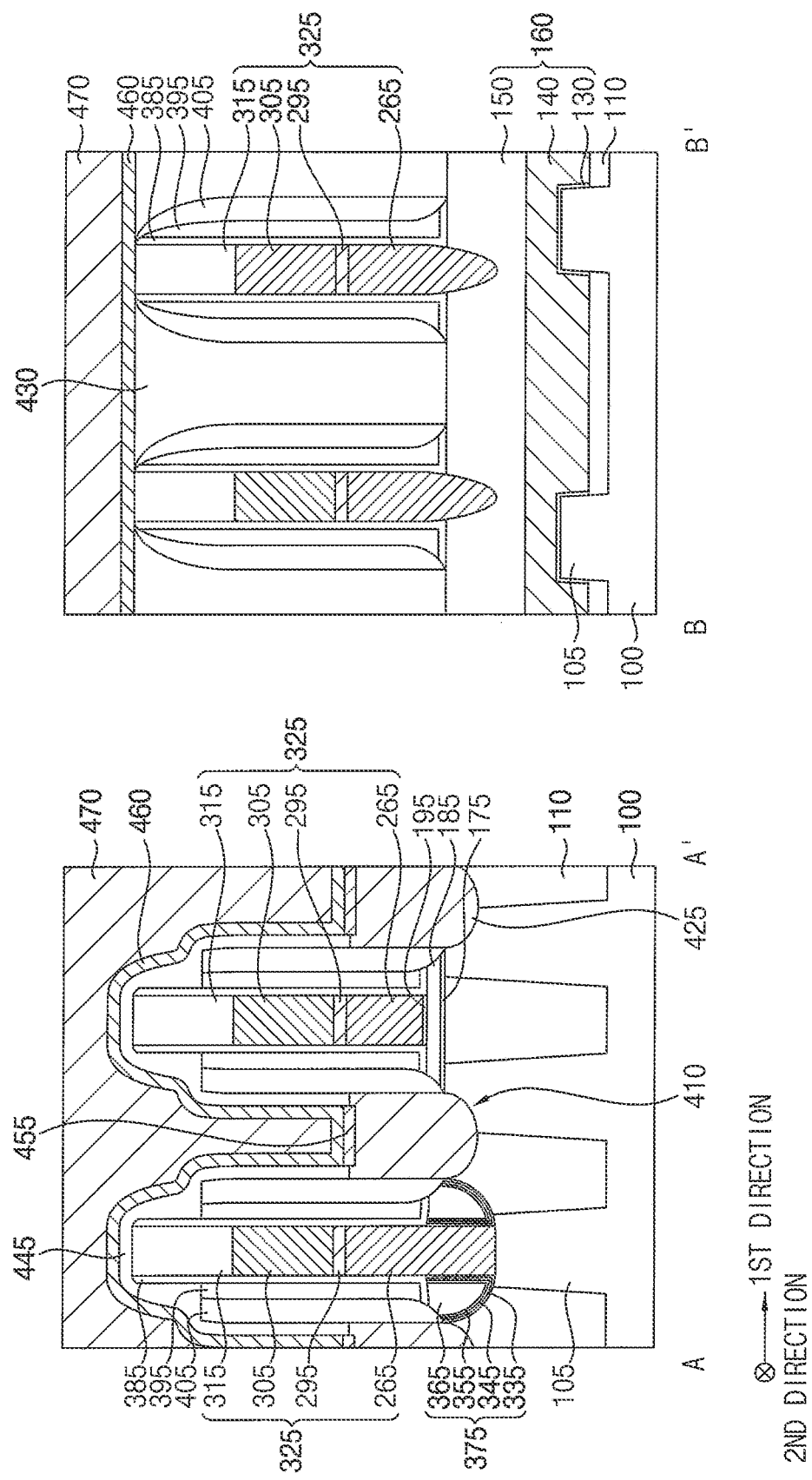

Referring to FIG. 19, a barrier layer 460 may be formed on the fourth upper spacer 445, the ohmic contact pattern 455, and the first and second capping patterns 315 and 430, an upper contact plug layer 470 may be formed on the barrier layer 460 to fill a space between the bit line structures 325, and an upper portion of the upper contact plug layer 470 may be planarized.

In example embodiments, an upper surface of the upper contact plug layer 470 may be higher than upper surfaces of the first and second capping patterns 315 and 430.

Figure 20:
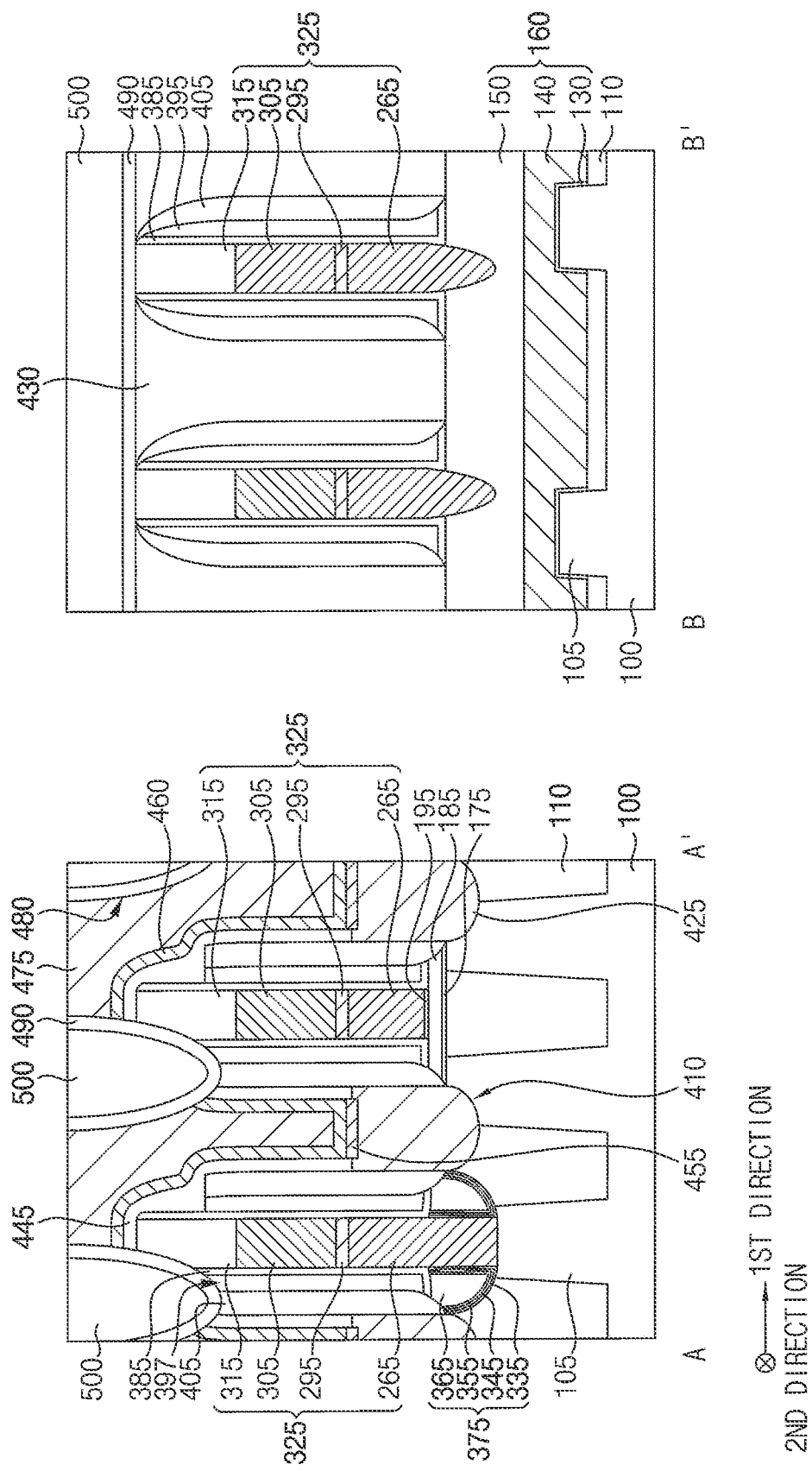

Referring to FIG. 20, an upper portion of the upper contact plug layer 470, a portion of the barrier layer 460, an upper portion of the first capping pattern 315, and upper portions of the first, third and fourth lower spacers 335, 385 and 425 may be removed to form a second hole 480, and thus an upper surface of the second upper spacer 395 may be exposed.

As the second hole 480 is formed, the upper contact plug layer 470 may be transformed into an upper contact plug 475. In example embodiments, a plurality of upper contact plugs 475 may be formed to be spaced apart from each other in each of the first and second directions and may be arranged in a honeycomb pattern in a plan view. Each of the upper contact plugs 475 may have a shape of a circle, ellipse, or polygon in a plan view.

The lower contact plug 425, the ohmic contact pattern 455, the barrier layer 460, and the upper contact plug 475 sequentially stacked on the substrate 100 may form a contact plug structure.

The exposed second spacer 395 may be removed to form an air gap 397 connected to the second hole 480. The second spacer 395 may be removed by, e.g., a wet etching process.

In example embodiments, not only a portion of the second spacer 395 on the sidewall of the bit line structure 325 extending in the second direction directly exposed by the second hole 480 but also other portions of the second spacer 395 parallel to the directly exposed portion thereof in the horizontal direction may be removed. That is, not only the portion of the second spacer 395 exposed by the second hole 480 not to be covered by the upper contact plug 475 but also a portion of the second spacer 395 adjacent to the exposed portion in the second direction to be covered by the second capping pattern 430 and a portion of the second spacer 395 adjacent to the exposed portion in the second direction to be covered by the upper contact plug 475 may be all removed.

First and second insulating interlayers 490 and 500 may be sequentially stacked to fill the second hole 480. The first and second insulating interlayers 490 and 500 may be also sequentially stacked on the second capping pattern 430.

The first insulating interlayer 490 may include a material having a low gap filling characteristic, and thus the air gap 397 under the second hole 480 may not be filled. The air gap 397 may be also referred to as an air spacer 397 and may form an upper spacer structure together with the first, third and fourth upper spacers 385, 405 and 445. That is, the air gap 397 may be a spacer including, for example, an air.

Referring to FIGS. 1 and 2 again, a capacitor 550 may be formed to contact the upper surface of the upper contact plug 475.

Particularly, an etch stop layer 510 and a mold layer (not shown) may be sequentially formed on the upper contact plug 475 and the first and second insulating interlayers 490 and 500, and partially etched to form a third hole partially exposing the upper surface of the upper contact plug 475.

A lower electrode layer (not shown) may be formed on a sidewall of the third hole, the exposed upper surface of the upper contact plug 475 and the mold layer, a sacrificial layer (not shown) may be formed on the lower electrode layer to fill the third hole, and the lower electrode layer and the sacrificial layer may be planarized until an upper surface of the mold layer is exposed to divide the lower electrode layer. The sacrificial layer and the mold layer may be removed by, e.g., a wet etching process, and thus a lower electrode 520 having a cylindrical shape may be formed on the exposed upper surface of the upper contact plug 475. Alternatively, the lower electrode 520 may have a pillar shape filling the third hole.

A dielectric layer 530 may be formed on a surface of the lower electrode 520 and the etch stop layer 510, and an upper electrode 540 may be formed on the dielectric layer 530 so that the capacitor 550 including the lower electrode 520, the dielectric layer 530 and the upper electrode 540 may be formed.

A third insulating interlayer 560 may be formed to cover the capacitor 550 on the substrate 100 to complete the fabrication of a portion of the semiconductor device. For example, the third insulating interlayer 560 may include an oxide, e.g., silicon oxide.

FIGS. 21 to 24 are cross-sectional views of a region X of FIG. 2 in accordance with example embodiments of the inventive concepts. These semiconductor devices may be substantially the same as or similar to that of FIGS. 1 and 2, except for some elements. Thus, like reference numerals refer to like elements, and detailed descriptions on several elements may be omitted herein.

Figure 21:
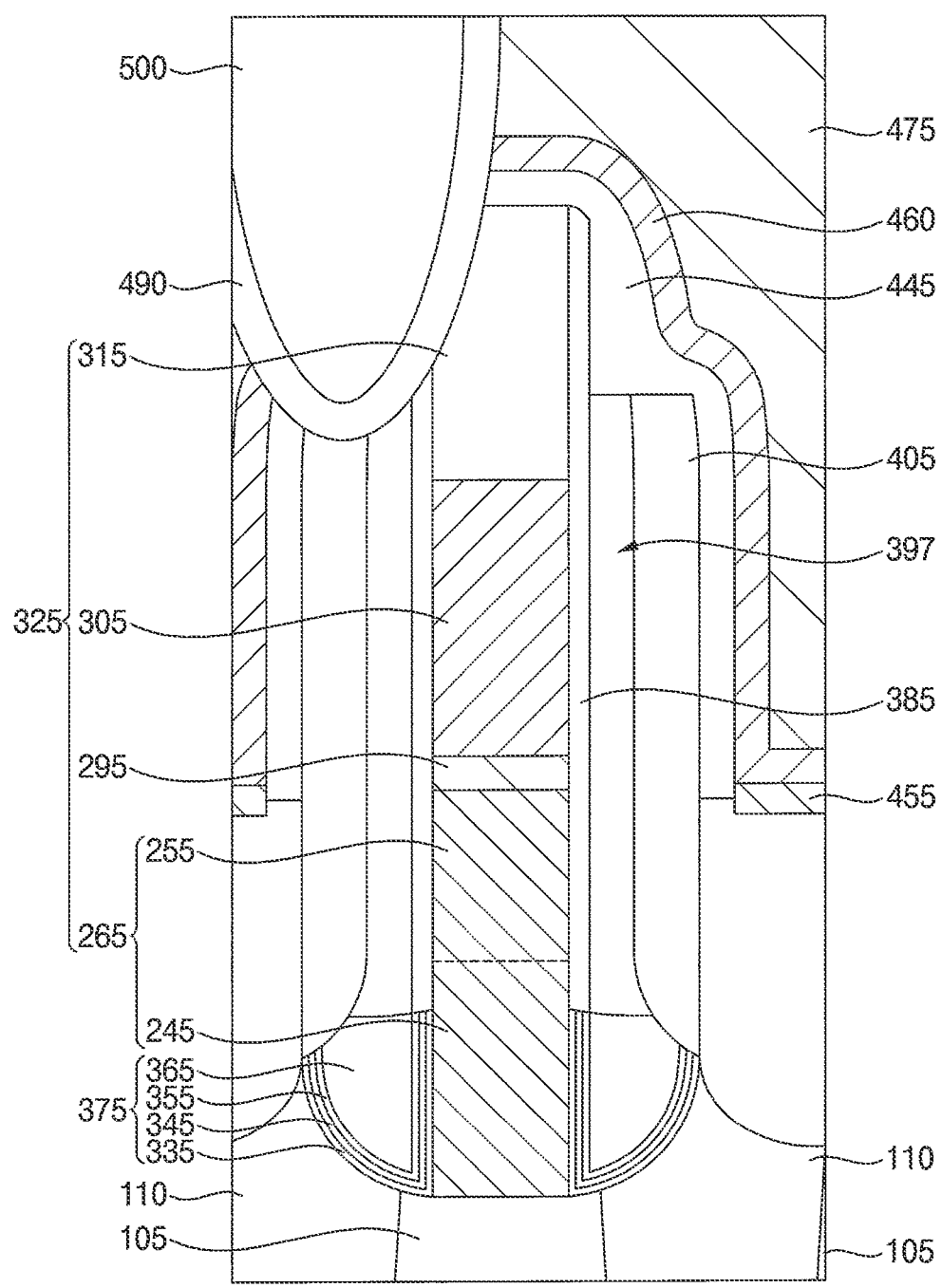
FIGS. 21 to 24 are cross-sectional views of a region X of FIG. 2 in accordance with example embodiments of the inventive concepts.

Referring to FIG. 21, the upper spacer 385 included in the upper spacer structure may have a cross-section in the first direction, which may not have an "L" shape. Thus, not only a lower surface of the first upper spacer 385 but also a bottom of the air spacer 397 may contact an upper surface of the first lower spacer structure 375. In some embodiments, the upper spacer 385 may have a line shape as illustrated in FIG. 21.

In the processes illustrated with reference to FIGS. 11 and 12, instead of sequentially stacking the first and second upper spacer layers 370 and 380 and anisotropically etching the first and second spacer layers 370 and 280, the first upper spacer layer 370 may be formed and anisotropically etched, and the second upper spacer layer 380 may be formed and anisotropically etched, so that the upper spacer 385 may have the shape shown in FIG. 21.

Figure 22:
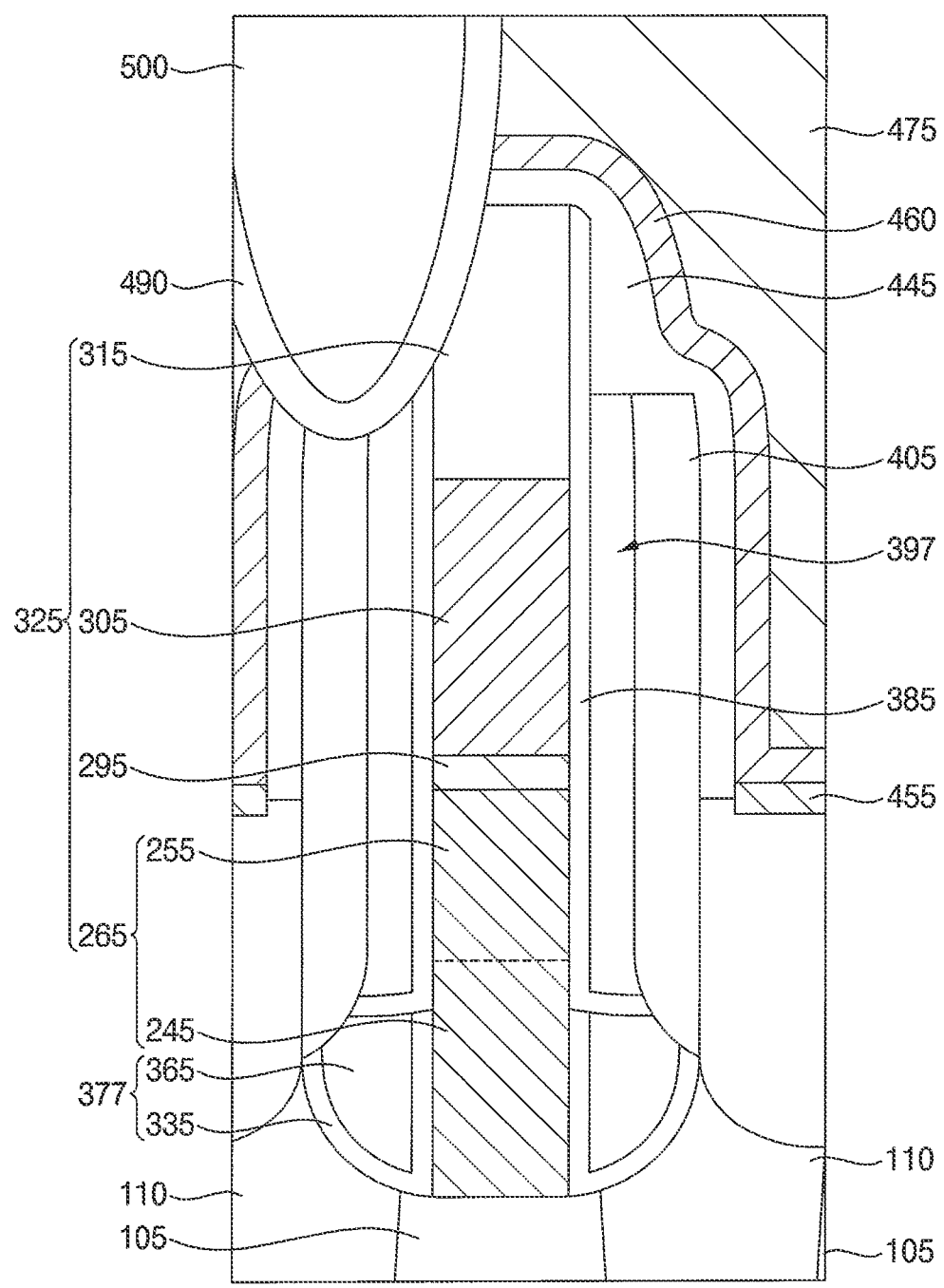

Referring to FIG. 22, the semiconductor device may include a second lower spacer structure 377 instead of the first lower spacer structure 375, and the second lower spacer structure 377 may not include the second and third lower spacers 345 and 355 but may include only the first and fourth lower spacers 335 and 365.

The first lower spacer 335 may not include nitrogen, and thus, as the semiconductor device shown in FIGS. 1 and 2, currents may easily flow through the conductive structure 265 of the bit line structure 325.

Figure 23:
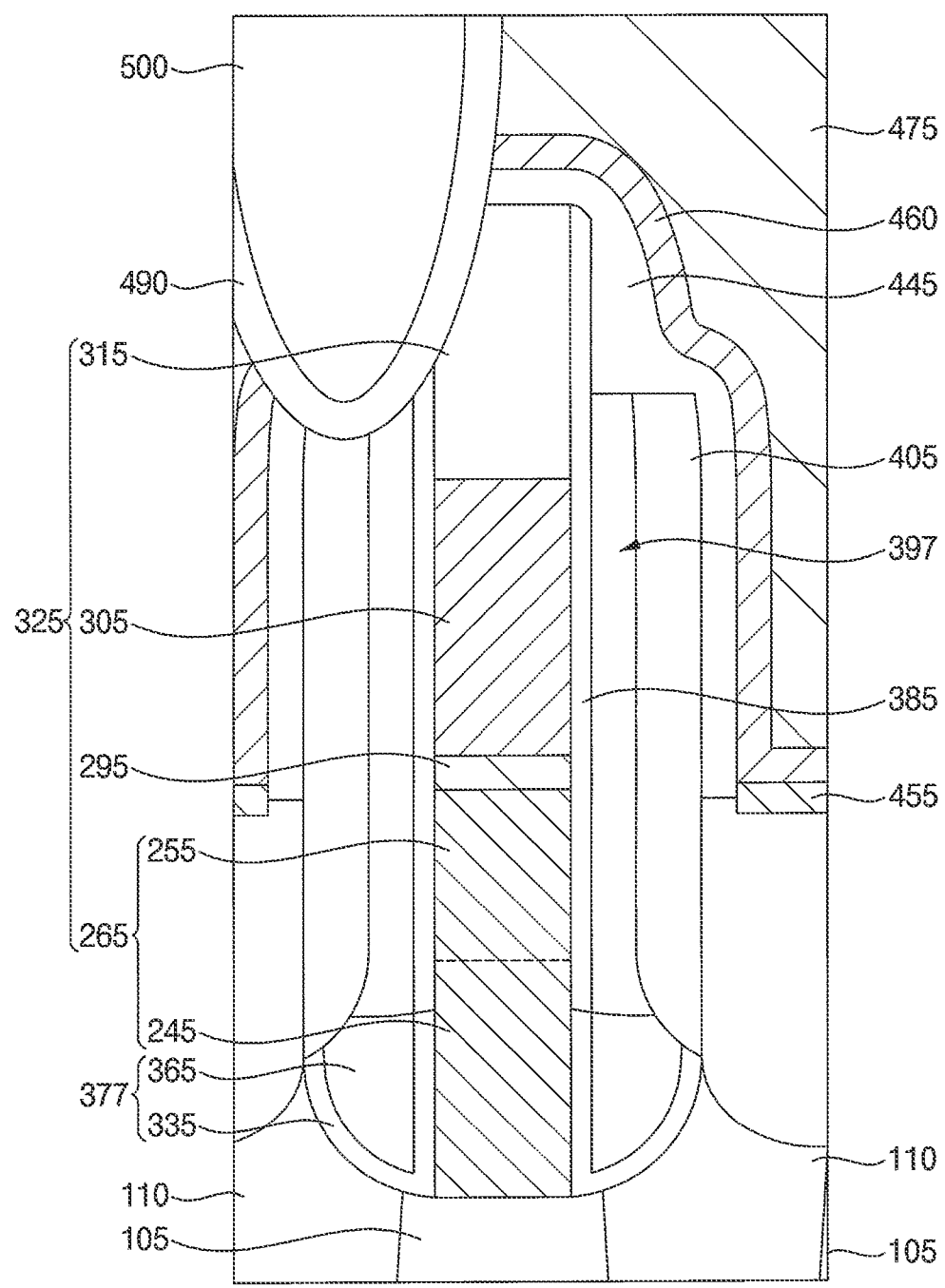

Referring to FIG. 23, unlike that of FIG. 22, the cross-section in the first direction of the first upper spacer 385 included in the upper spacer structure may not have an "L" shape, and thus not only a lower surface of the first upper spacer 385 but also a bottom of the air spacer 397 may contact an upper surface of the first lower spacer structure 375. In some embodiments, the upper spacer 385 may have a line shape as illustrated in FIG. 23.

Figure 24:
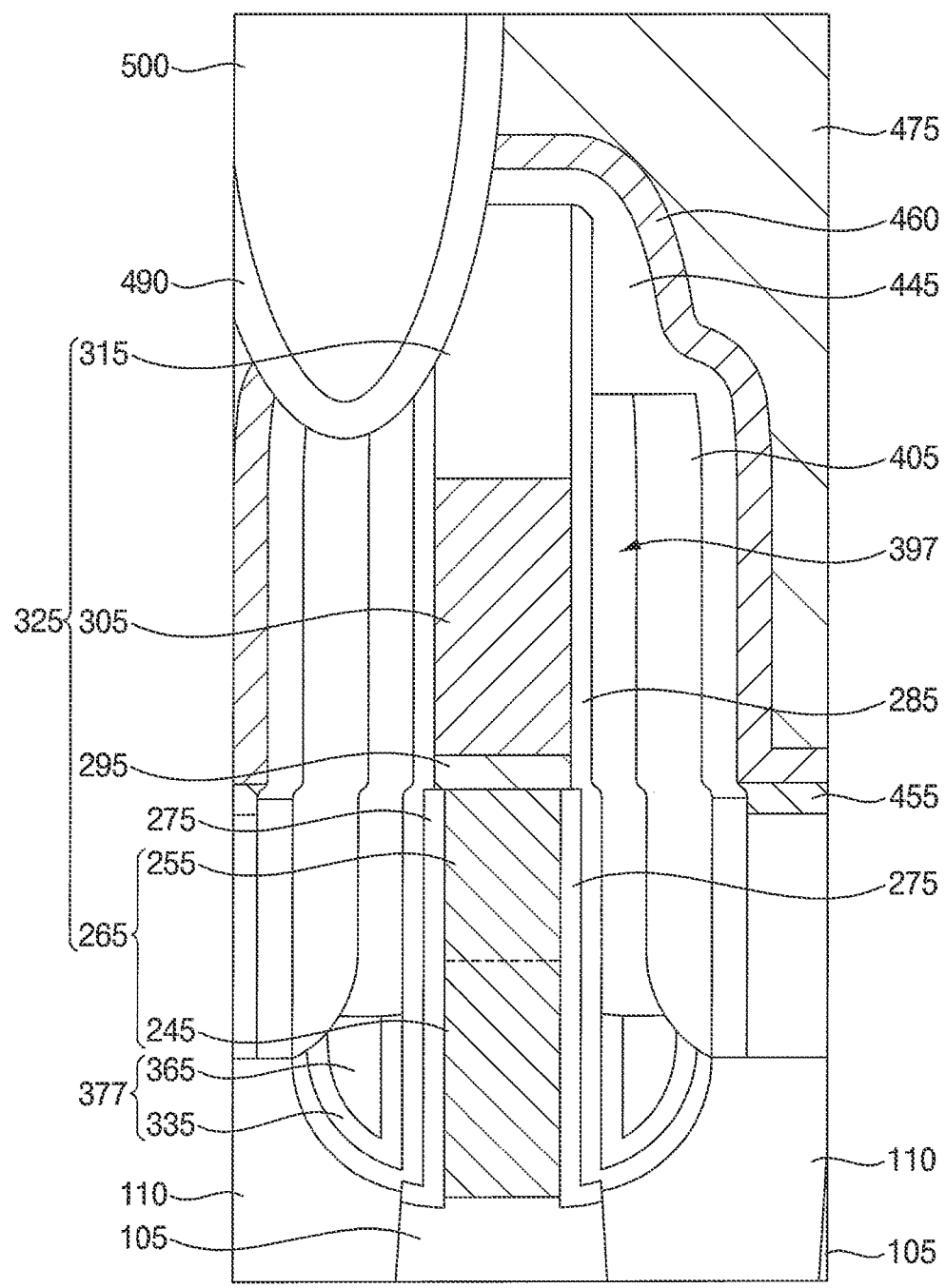

Referring to FIG. 24, the semiconductor device may include a first spacer 275 on the sidewall of the conductive structure 265 of the bit line structure 325, a second spacer 285 on the sidewall of the bit line structure 325, an outer sidewall of the first spacer 275 and the inner wall of the second recess 230, the first and fourth lower spacers 335 and 365 on the second spacer 285 in the second recess 230, the air spacer 397 on the first and fourth lower spacers 335 and 365 and covering a portion of the outer sidewall of the second spacer 285, the third upper spacer 405 covering the outer sidewall of the air spacer 397, and the fourth upper spacer 445 contacting the upper surface of the first capping pattern 315, an upper surface and an upper outer sidewall of the second spacer 285, the top of the air spacer 397, and the upper surface and the upper outer sidewall of the third upper spacer 405.

In example embodiments, the first spacer 275 may include, e.g., silicon oxide, and may be formed not only on the sidewall of the conductive structure 265 but also on the edge upper surface of the active pattern 105 in the second recess 230.

The second spacer 285 may cover the upper sidewall of the bit line structure 325 not covered by the first spacer 275 and the outer sidewall of the first spacer 275 and may also cover the bottom of the second recess 230. The second spacer 285 may include a nitride, e.g., silicon nitride.

An entire sidewall of the conductive structure 265 including, e.g., polysilicon doped with n-type impurities may be covered by the first spacer 275 not containing nitrogen, and thus electrons may not be trapped in the first spacer 275. Accordingly, currents may easily flow through the conductive structure 265.

Figure 25:
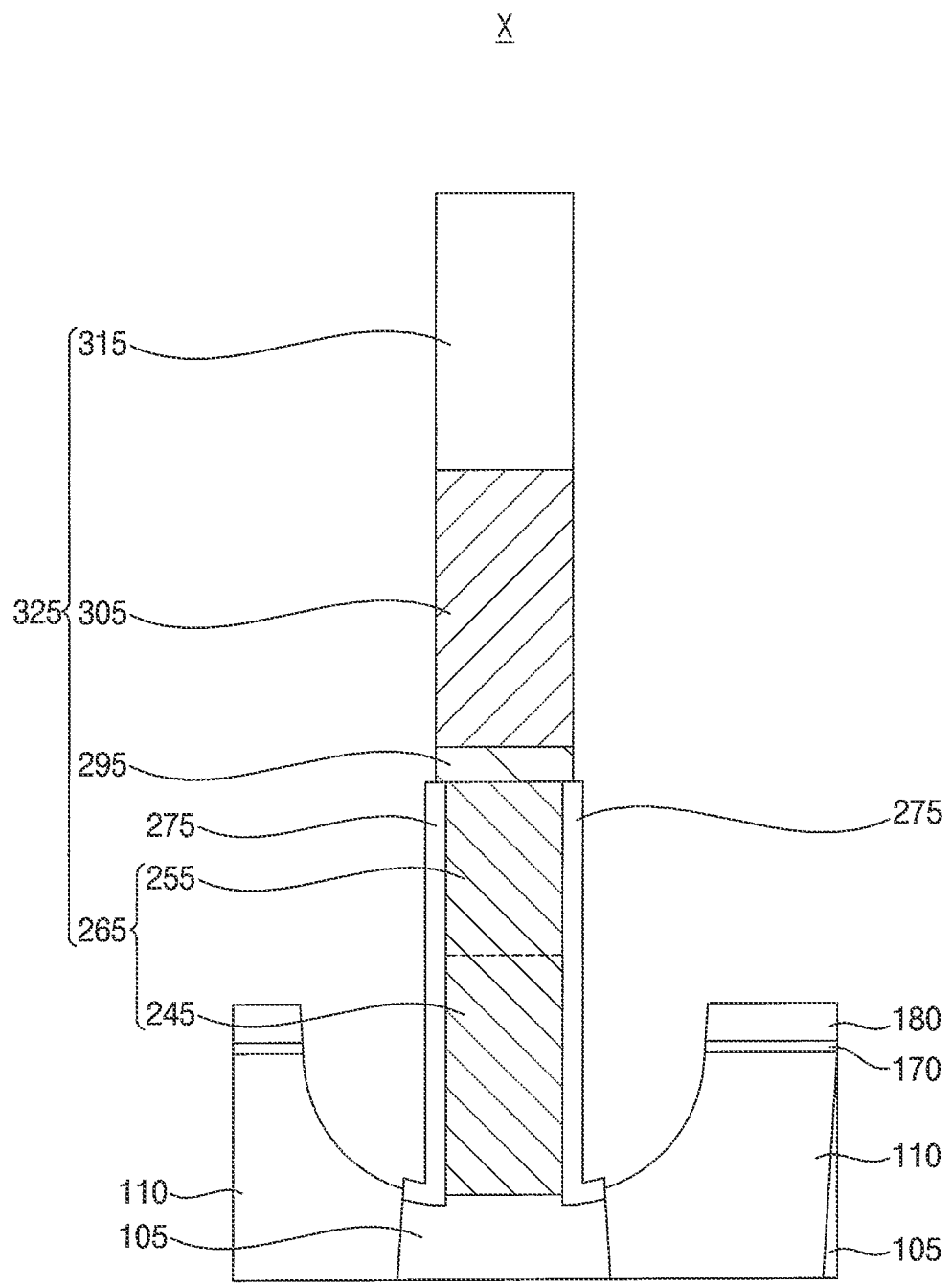
FIGS. 25 to 27 are cross-sectional views of a region X of FIG. 2 illustrating a method of manufacturing a semiconductor device in accordance with example embodiments of the inventive concepts.
Figure 26:
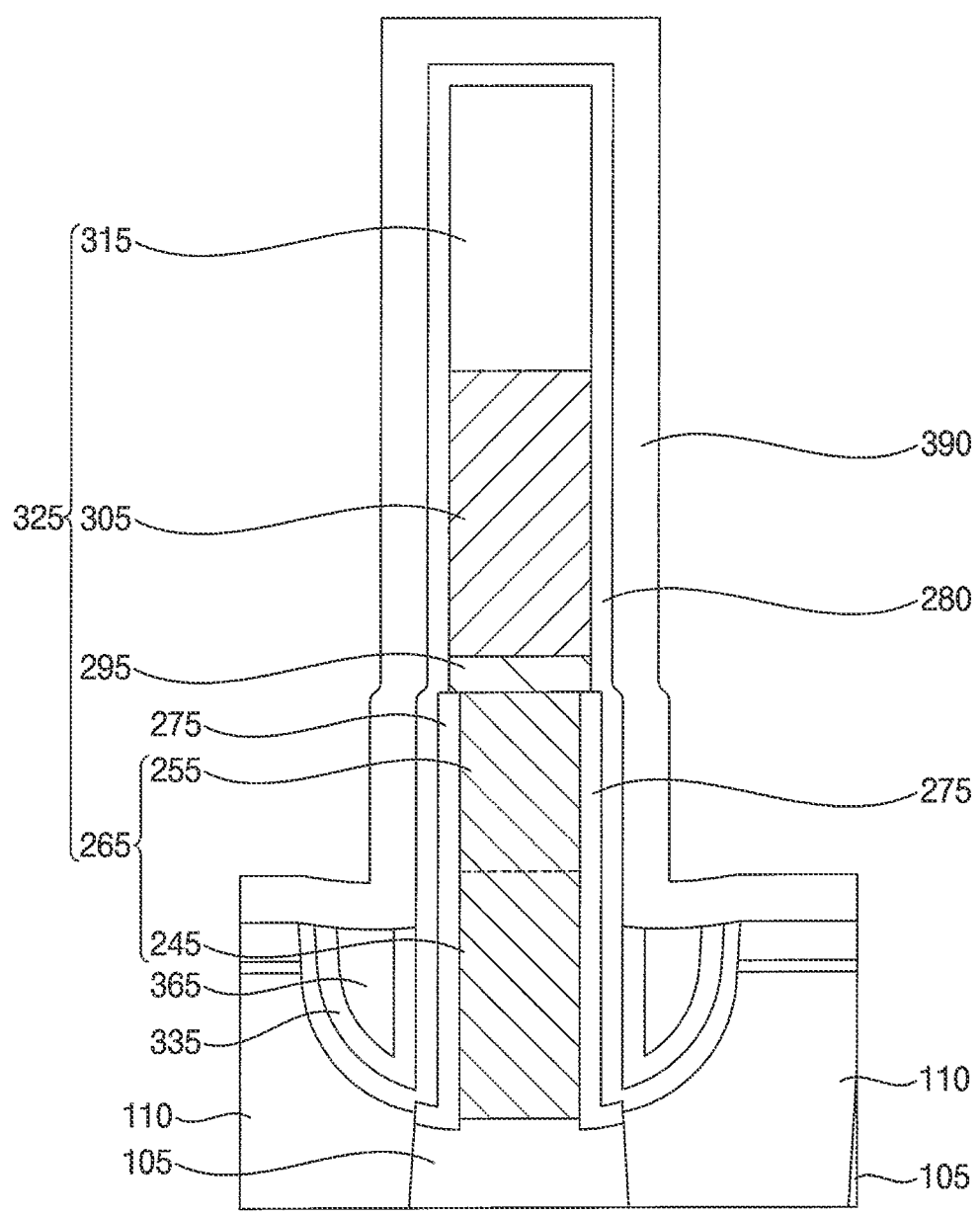
Figure 27:
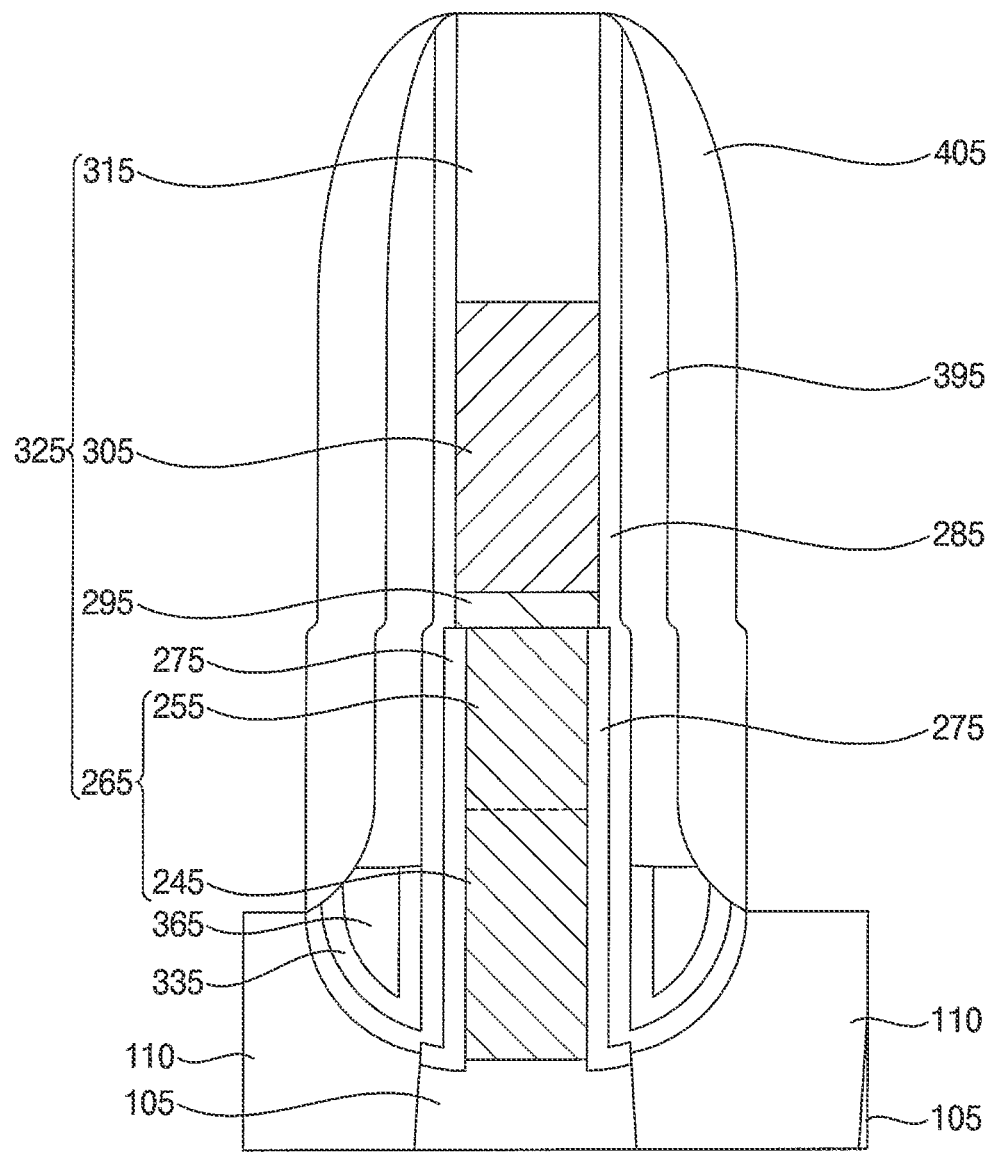

FIGS. 25 to 27 are cross-sectional views of a region X of FIG. 2 illustrating a method of manufacturing a semiconductor device in accordance with example embodiments. This method may include several processes substantially the same as or similar to those illustrated with reference to FIGS. 3 to 20 and FIGS. 1 and 2 and thus repeated explanations may be omitted herein.

Referring to FIG. 25, processes substantially the same as or similar to those illustrated with reference to FIGS. 3 to 9 may be performed, and an oxidation process may be performed on the sidewall of the conductive structure 265 of the bit line structure 325.

Thus, a first spacer 275 may be formed on each of opposite sidewalls in the first direction of the conductive structure 265 that may include polysilicon doped with n-type impurities, and the first spacer 275 may be formed on a portion of the upper surface of the active pattern 105 including silicon.

Referring to FIG. 26, a second spacer layer 280 may be formed on the sidewall and the upper surface of the bit line structure 325, the first spacer 275, the inner wall of the first hole 230, the upper surface of the second insulation layer 180, and the sidewall of the third insulation pattern 195, the first and fourth lower spacer layers 330 and 360 may be sequentially formed on the second spacer layer 280, and a wet etching process may be performed on the first and fourth lower spacer layers 330 and 360, and thus the first and fourth lower spacers 335 and 365 may be formed in the first hole 230.

The second upper spacer layer 390 may be formed on the second spacer layer 280, the first and fourth lower spacers 335 and 365, the second insulation layer 180 and the third insulation pattern 195.

Referring to FIG. 27, the second upper spacer layer 390 and the second spacer layer 280 may be anisotropically etched to form the second upper spacer 395 and a second spacer 285, respectively.

Processes substantially the same as or similar to those illustrated with reference to FIG. 13 may be performed to form the third upper spacer 405.

processes substantially the same as or similar to those illustrated with reference to FIGS. 14 to 20 and FIGS. 1 and 2 may be performed to complete the fabrication of a portion of the semiconductor device.

While the present inventive concepts have been shown and described with reference to some example embodiments thereof, it will be understood by those of ordinary skill in the art that various changes in form and details may be made thereto without departing from the scope of the present inventive concepts as set forth by the following claims. Accordingly, the above-disclosed subject matter is to be considered illustrative, and not restrictive, and the appended claims are intended to cover all such modifications, enhancements, and other embodiments, which fall within the scope of the inventive concepts. Thus, to the maximum extent allowed by law, the scope is to be determined by the broadest permissible interpretation of the following claims and their equivalents and shall not be restricted or limited by the foregoing detailed description.

What is claimed is:

1. A semiconductor device comprising:
   an active pattern on a substrate;
   a gate structure in an upper portion of the active pattern, the gate structure extending in a first direction that is parallel to an upper surface of the substrate;
   a bit line structure extending in a second direction that is parallel to the upper surface of the substrate and is perpendicular to the first direction, an upper surface of a middle portion of the active pattern in a length direction of the active pattern being recessed toward the substrate, the bit line structure contacting the upper surface of the middle portion of the active pattern, and the bit line structure including a first conductive pattern, a diffusion barrier, a second conductive pattern and a capping pattern sequentially stacked on the substrate;
   a lower spacer structure extending on a portion of a sidewall of the first conductive pattern of the bit line structure, the lower spacer structure including a first lower spacer and a second lower spacer sequentially stacked on the portion of the sidewall of the first conductive pattern of the bit line structure;
   an upper spacer structure extending on a portion of a sidewall of the bit line structure, the lower spacer structure not covering the portion of the sidewall of the bit line structure, and the upper spacer structure including a first upper spacer, a second upper spacer, and a third upper spacer sequentially stacked on the portion of the sidewall of the bit line structure;
   a contact plug structure on one of opposing end portions of the active pattern in the length direction of the active pattern, the contact plug structure including a lower contact plug, an ohmic contact pattern, a barrier layer and an upper contact plug sequentially stacked on the substrate; and
   a capacitor on the contact plug structure,
   wherein the first lower spacer contacts the portion of the sidewall of the first conductive pattern of the bit line structure and does not include nitrogen, and the second lower spacer includes a material different from that of the first lower spacer,
   wherein the first upper spacer contacts the portion of the sidewall of the bit line structure and includes a material different from that of the first lower spacer, and
   wherein each of the first, second, and third upper spacers directly contacts an upper surface of the lower spacer structure.

2. The semiconductor device according to claim 1, wherein the first lower spacer includes silicon oxide or silicon oxycarbide.

3. The semiconductor device according to claim 1, wherein the first lower spacer includes oxide, and the second lower spacer includes nitride.

4. The semiconductor device according to claim 3, further comprising third and fourth lower spacers sequentially stacked between the first and second lower spacers,
   wherein the third lower spacer includes nitride, and the fourth lower spacer includes oxide.

5. The semiconductor device according to claim 1, wherein the first lower spacer extends on a sidewall of the second lower spacer.

6. The semiconductor device according to claim 1, wherein the first upper spacer includes nitride.

7. The semiconductor device according to claim 6, wherein the second upper spacer is an air spacer, and
   wherein the third upper spacer includes nitride.

8. The semiconductor device according to claim 1, wherein the first upper spacer has a cross-section having an "L" shape.

9. The semiconductor device according to claim 1, wherein upper surfaces of the second and third upper spacers are lower than an upper surface of the first upper spacer relative to the substrate.

10. The semiconductor device according to claim 1, further comprising a fourth upper spacer extending on upper surfaces of the first, second, and third upper spacers and an outer sidewall of the third upper spacer.

11. The semiconductor device according to claim 1, wherein the first conductive pattern includes polysilicon doped with n-type impurities, the diffusion barrier includes metal silicon nitride, the second conductive pattern includes metal, and the capping pattern includes nitride.

12. The semiconductor device according to claim 1, wherein the lower contact plug includes doped polysilicon, the ohmic contact pattern includes metal silicide, the barrier layer includes metal nitride, and the upper contact plug includes metal.

13. The semiconductor device according to claim 1, wherein the active pattern extends in a third direction that is parallel to the upper surface of the substrate and forms an acute angle with each of the first and second directions.

14. The semiconductor device according to claim 13, wherein the upper surface of the middle portion of the active pattern defines a recess, and a lower portion of the bit line structure is in the recess, and
   wherein the lower spacer structure extends on a sidewall of the lower portion of the bit line structure.

15. A semiconductor device comprising:
   an active pattern on a substrate;
   a gate structure in an upper portion of the active pattern, the gate structure extending in a first direction that is parallel to an upper surface of the substrate;
   a bit line structure extending in a second direction that is parallel to the upper surface of the substrate and is perpendicular to the first direction, an upper surface of a middle portion of the active pattern in a length direction of the active pattern being recessed toward the substrate, the bit line structure contacting the upper surface of the middle portion of the active pattern, and the bit line structure including a first conductive pattern, a diffusion barrier, a second conductive pattern and a capping pattern sequentially stacked on the substrate;

a lower spacer structure extending on a portion of a sidewall of the first conductive pattern of the bit line structure, the lower spacer structure including a first lower spacer and a second lower spacer sequentially stacked on the portion of the sidewall of the first conductive pattern of the bit line structure;

an upper spacer structure extending on a portion of a sidewall of the bit line structure, the lower spacer structure not covering the portion of the sidewall of the bit line structure, and the upper spacer structure including a first upper spacer, a second upper spacer, and a third upper spacer sequentially stacked on the portion of the sidewall of the bit line structure;

a contact plug structure on one of opposing end portions of the active pattern in the length direction of the active pattern, the contact plug structure including a lower contact plug, an ohmic contact pattern, a barrier layer and an upper contact plug sequentially stacked on the substrate; and a capacitor on the contact plug structure, wherein the first lower spacer contacts the portion of the sidewall of the first conductive pattern of the bit line structure and does not include nitrogen, and the second lower spacer includes a material different from that of the first lower spacer, wherein the first upper spacer contacts the portion of the sidewall of the bit line structure and includes a material different from that of the first lower spacer, and wherein the barrier layer includes a conductive metal nitride.

16. The semiconductor device according to claim 15, further comprising a fourth upper spacer extending on upper surfaces of the first, second, and third upper spacers and an outer sidewall of the third upper spacer.

17. The semiconductor device according to claim 16, wherein the barrier layer is on an upper surface of the ohmic contact pattern, a sidewall of the fourth upper spacer, and an upper surface of the fourth upper spacer.

18. A semiconductor device comprising:
an active pattern on a substrate;
a gate structure in an upper portion of the active pattern, the gate structure extending in a first direction that is parallel to an upper surface of the substrate;
a bit line structure extending in a second direction that is parallel to the upper surface of the substrate and is perpendicular to the first direction, an upper surface of a middle portion of the active pattern in a length direction of the active pattern being recessed toward the substrate, the bit line structure contacting the upper surface of the middle portion of the active pattern, and the bit line structure including a first conductive pattern, a diffusion barrier, a second conductive pattern and a capping pattern sequentially stacked on the substrate;

a lower spacer structure extending on a portion of a sidewall of the first conductive pattern of the bit line structure, the lower spacer structure including a first lower spacer and a second lower spacer sequentially stacked on the portion of the sidewall of the first conductive pattern of the bit line structure;

an upper spacer structure extending on a portion of a sidewall of the bit line structure, the lower spacer structure not covering the portion of the sidewall of the bit line structure, and the upper spacer structure including a first upper spacer, a second upper spacer, and a third upper spacer sequentially stacked on the portion of the sidewall of the bit line structure;

a contact plug structure on one of opposing end portions of the active pattern in the length direction of the active pattern, the contact plug structure including a lower contact plug, an ohmic contact pattern, a barrier layer and an upper contact plug sequentially stacked on the substrate; and a capacitor on the contact plug structure, wherein the first lower spacer contacts the portion of the sidewall of the first conductive pattern of the bit line structure and does not include nitrogen, and the second lower spacer includes a material different from that of the first lower spacer, wherein the first upper spacer contacts the portion of the sidewall of the bit line structure and includes a material different from that of the first lower spacer, and wherein the second lower spacer is between the lower contact plug and the first conductive pattern of the bit line structure in the first direction, and is spaced apart from the lower contact plug and the first conductive pattern of the bit line structure.

19. The semiconductor device according to claim 18, wherein a first portion of the first lower spacer is between the second lower spacer and the first conductive pattern of the bit line structure in the first direction, and wherein a second portion of the first lower spacer is between the second lower spacer and the lower contact plug in the first direction.

20. The semiconductor device according to claim 19, wherein the lower contact plug contacts an outer sidewall of the third upper spacer, and wherein at least a portion of the third upper spacer is between the second lower spacer and the lower contact plug in the first direction.

* * * * *